(12) United States Patent
Lee et al.

(10) Patent No.: US 10,930,593 B2
(45) Date of Patent: Feb. 23, 2021

(54) PACKAGE ON PACKAGE AND PACKAGE CONNECTION SYSTEM COMPRISING THE SAME

(71) Applicant: SAMSUNG ELECTRONICS CO., LTD., Suwon-si (KR)

(72) Inventors: Young Kwan Lee, Suwon-si (KR); Yun Tae Lee, Suwon-si (KR); Young Sik Hur, Suwon-si (KR); Ho Kwon Yoon, Suwon-si (KR); Won Wook So, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/413,039

(22) Filed: May 15, 2019

(65) Prior Publication Data

US 2020/0294917 A1    Sep. 17, 2020

(30) Foreign Application Priority Data

Mar. 13, 2019 (KR) .................. 10-2019-0028668

(51) Int. Cl.
*H01L 23/528* (2006.01)
*H01L 25/16* (2006.01)
(Continued)

(52) U.S. Cl.
CPC ...... *H01L 23/5283* (2013.01); *H01L 23/3128* (2013.01); *H01L 23/5226* (2013.01); *H01L 24/09* (2013.01); *H01L 24/17* (2013.01); *H01L 25/16* (2013.01); *H01L 2224/02373* (2013.01); *H01L 2224/02377* (2013.01); *H01L 2224/02379* (2013.01); *H01L 2224/02381* (2013.01); *H01L 2224/0401* (2013.01); *H01L 2924/1433* (2013.01); *H01L 2924/1436* (2013.01); *H01L 2924/1438* (2013.01)

(58) Field of Classification Search
CPC .. G06F 15/7835; G06F 15/7832; G06F 15/82; H01L 2924/1433; H01L 23/5389; H06F 15/76
See application file for complete search history.

(56) References Cited

U.S. PATENT DOCUMENTS

2005/0127490 A1\*  6/2005  Black ................. H01L 25/0657
                                                  257/686
2015/0342051 A1    11/2015  Yu
(Continued)

FOREIGN PATENT DOCUMENTS

KR    10-2015-0134696 A    12/2015
KR    10-2016-0132763 A    11/2016

*Primary Examiner* — Alia Sabur
(74) *Attorney, Agent, or Firm* — Sughrue Mion, PLLC

(57) ABSTRACT

A package-on-package includes a first semiconductor package including a first semiconductor chip and a second semiconductor package, disposed on the first semiconductor package, including a second semiconductor chip electrically connected to the first semiconductor chip. Each of the first and second semiconductor chips includes one or more units. The number of units of the first semiconductor chip is greater than the number of units of the second semiconductor chip. The one or more units of the first semiconductor chip and the one or more units of the second semiconductor chip implement a function of an application processor chip.

17 Claims, 14 Drawing Sheets

(51) Int. Cl.
*H01L 23/00* (2006.01)
*H01L 23/31* (2006.01)
*H01L 23/522* (2006.01)

(56) References Cited

U.S. PATENT DOCUMENTS

2016/0338202 A1* 11/2016 Park .................. H01L 24/00
2018/0218710 A1* 8/2018 Park .................. G09G 5/00
2018/0260360 A1* 9/2018 Samadi ............ G06F 12/0875

* cited by examiner

PACKAGE ON PACKAGE AND PACKAGE CONNECTION SYSTEM COMPRISING THE SAME

CROSS-REFERENCE TO RELATED APPLICATION(S)

This application claims benefit of priority to Korean Patent Application No. 10-2019-0028668 filed on Mar. 13, 2019 in the Korean Intellectual Property Office, the disclosure of which is incorporated herein by reference in its entirety.

TECHNICAL FIELD

The present disclosure relates to a package-on-package (PoP) and a package connection system including the same.

BACKGROUND

As smart electronic devices have recently been developed, specifications of components, used in such devices, are increasing. For example, the specifications of an application processor (AP), a core chip of a smart electronic device, are rapidly being improved. Accordingly, main processor units, capable of driving various functions, and the like, are integrated in a single chip.

SUMMARY

An aspect of the present disclosure is that a specific unit of an application processor chip is separated as a semiconductor chip and performance of the specific unit are enhanced to differentiate functions of a set.

One proposal of the present disclosure is that a plurality of units, performing functions of a single application processor, are dispersed to a plurality of semiconductor chips, and then the plurality of semiconductor chips are arranged in a package-on-package (PoP) form.

According to an aspect of the present disclosure, a package-on-package includes a first semiconductor package including a first semiconductor chip and a second semiconductor package, disposed on the first semiconductor package, including a second semiconductor chip electrically connected to the first semiconductor chip. Each of the first and second semiconductor chips includes one or more units. The number of units of the first semiconductor chip is greater than the number of units of the second semiconductor chip. The one or more units of the first semiconductor chip and the one or more units of the second semiconductor chip implement a function of an application processor chip.

According to another aspect of the present disclosure, a package connection system includes a printed circuit board having a first surface and a second surface opposing the first surface, a package-on-package, disposed on the first surface of the printed circuit board, having a function of an application processor chip, a memory package, disposed on one of the first and second surfaces of the printed circuit board, having a memory function, and a power management package having a power management function and disposed on another of the first and second surfaces of the printed circuit board. The package-on-package includes a first semiconductor package including a first semiconductor chip and a second semiconductor package, disposed on the first semiconductor package, including a second semiconductor chip electrically connected to the first semiconductor chip. Each of the first and second semiconductor chips includes one or more units. The number of units of the first semiconductor chip is greater than the number of units of the second semiconductor chip. The one or more units of the first semiconductor chip and the one or more units of the second semiconductor chip implement a function of an application processor (AP) chip.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, embodiments of the present disclosure will be described as follows with reference to the attached drawings.

Electronic Device

Figure 1:
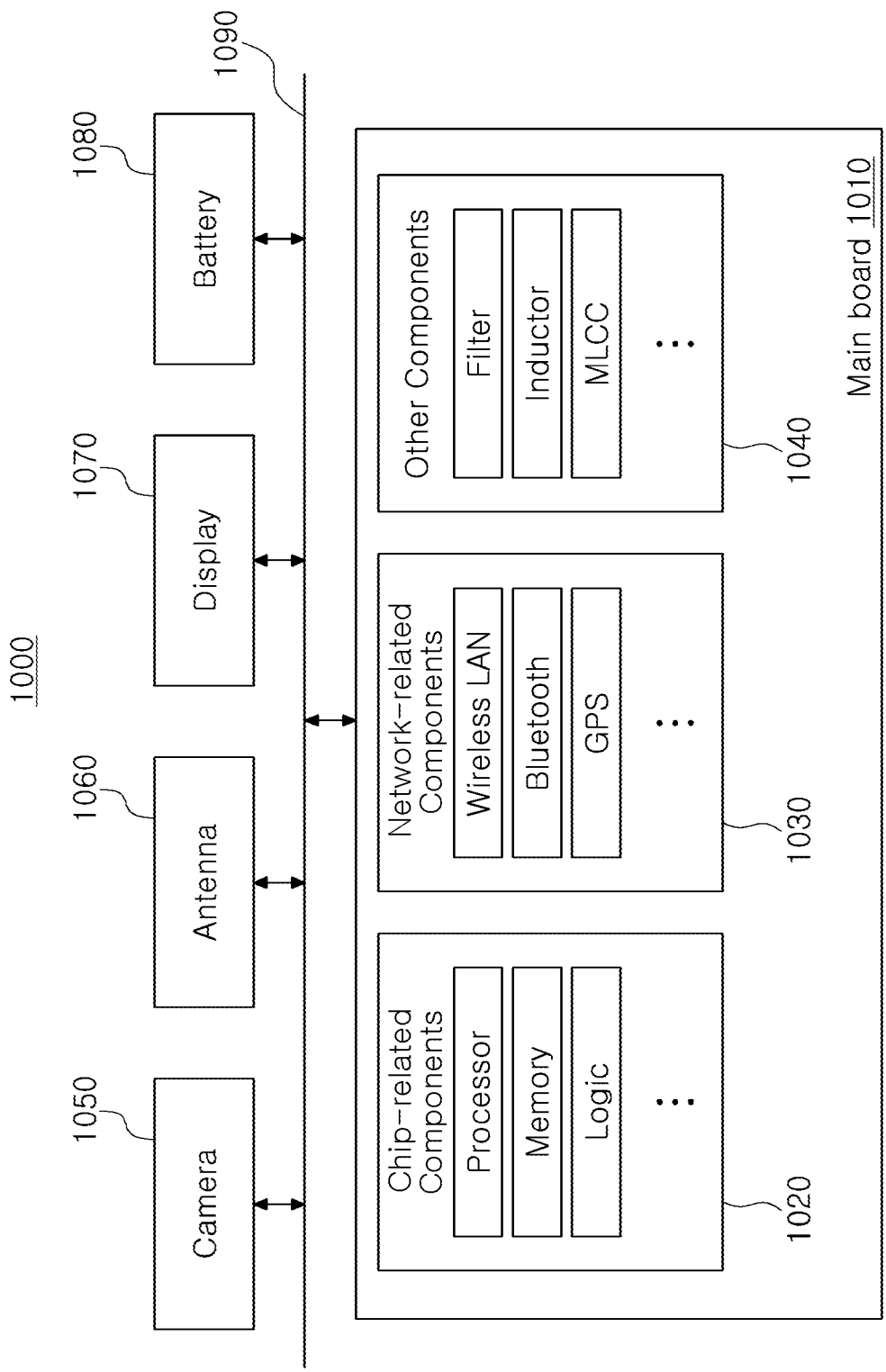
FIG. 1 is a block diagram schematically illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
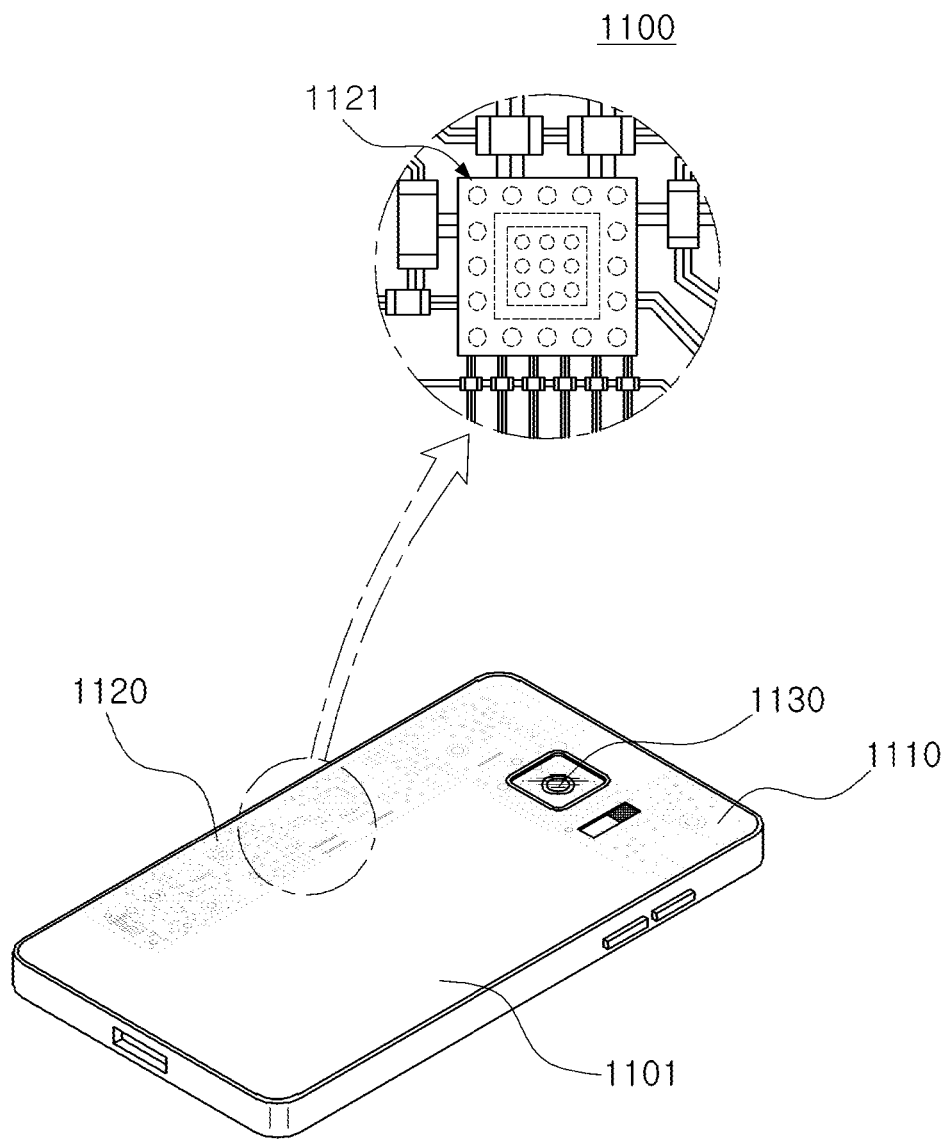
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
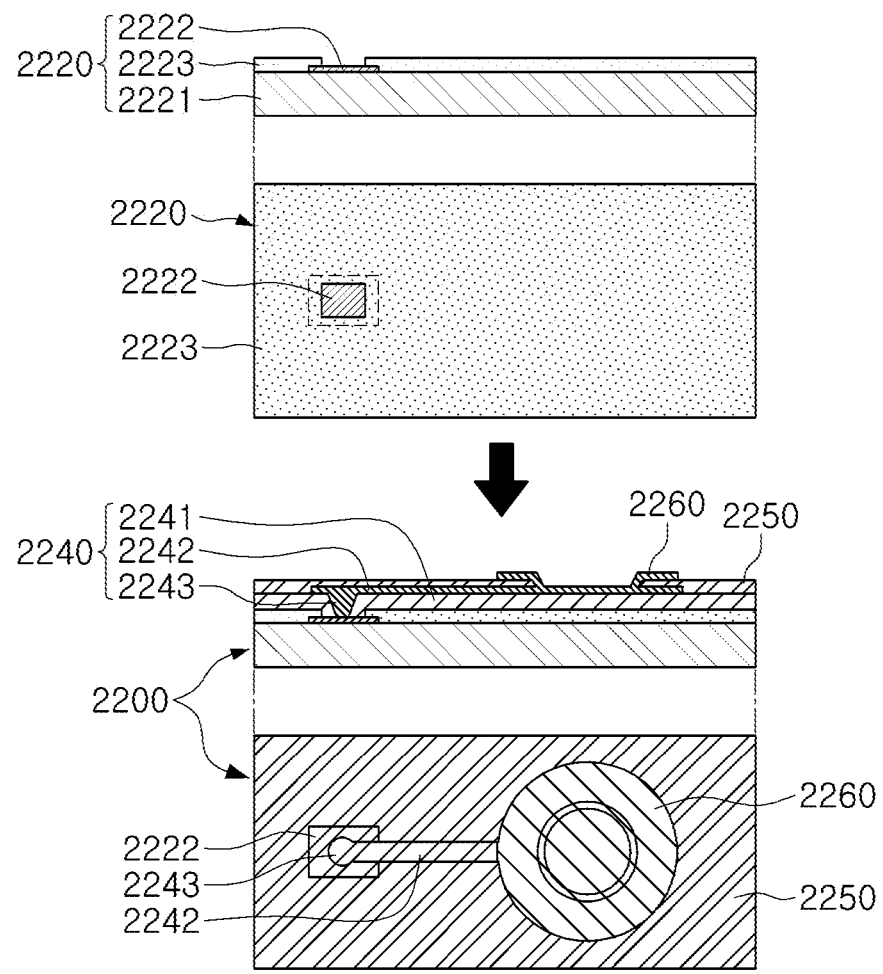
FIGS. 3A and 3B are schematic cross-sectional views illustrating states of a fan-in semiconductor package before and after being packaged.
Figure 3B:
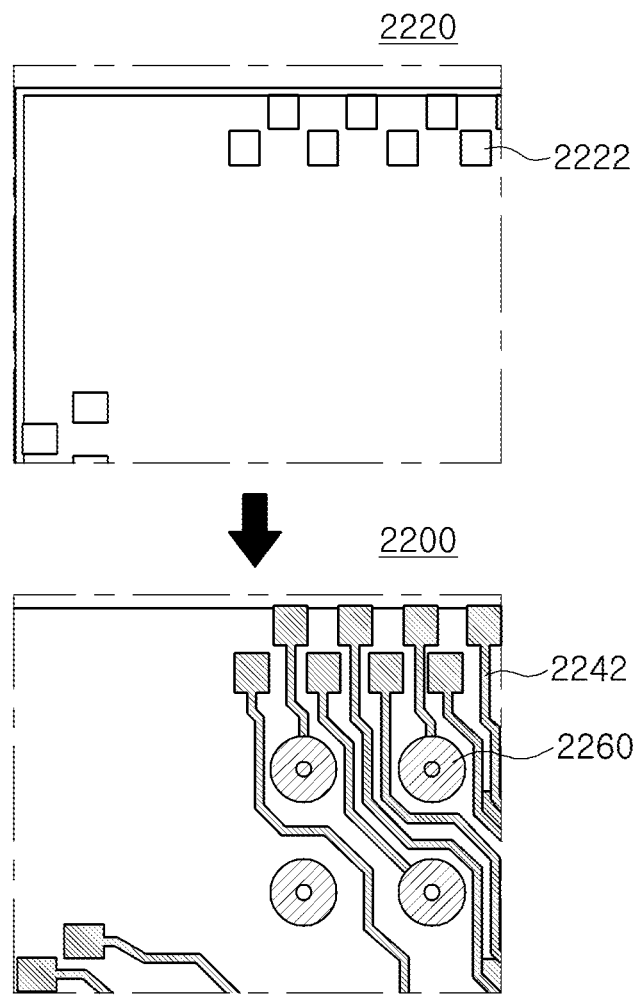

FIGS. 3A and 3B are schematic cross-sectional views illustrating states of a fan-in semiconductor package before and after being packaged.

Figure 4:
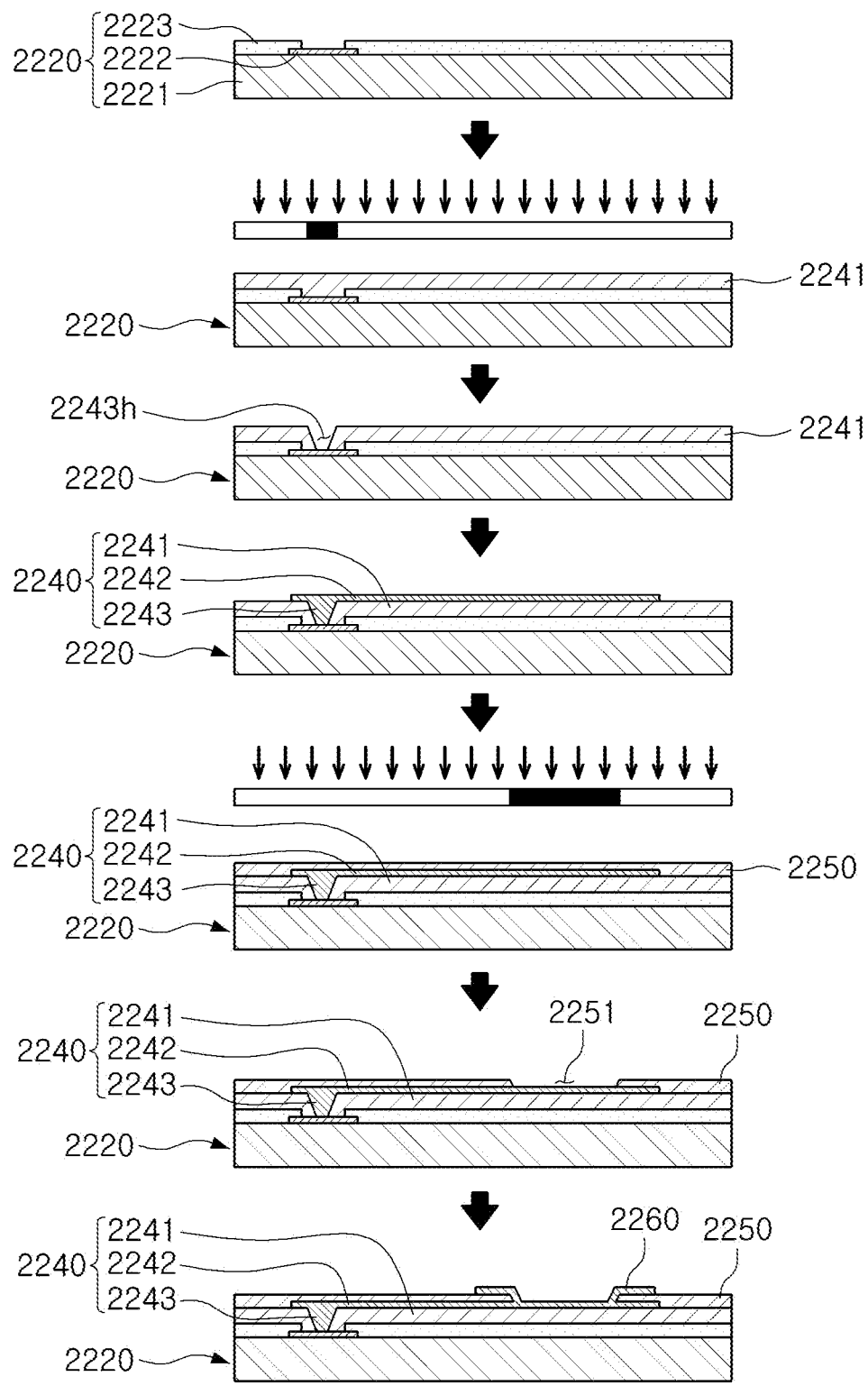
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
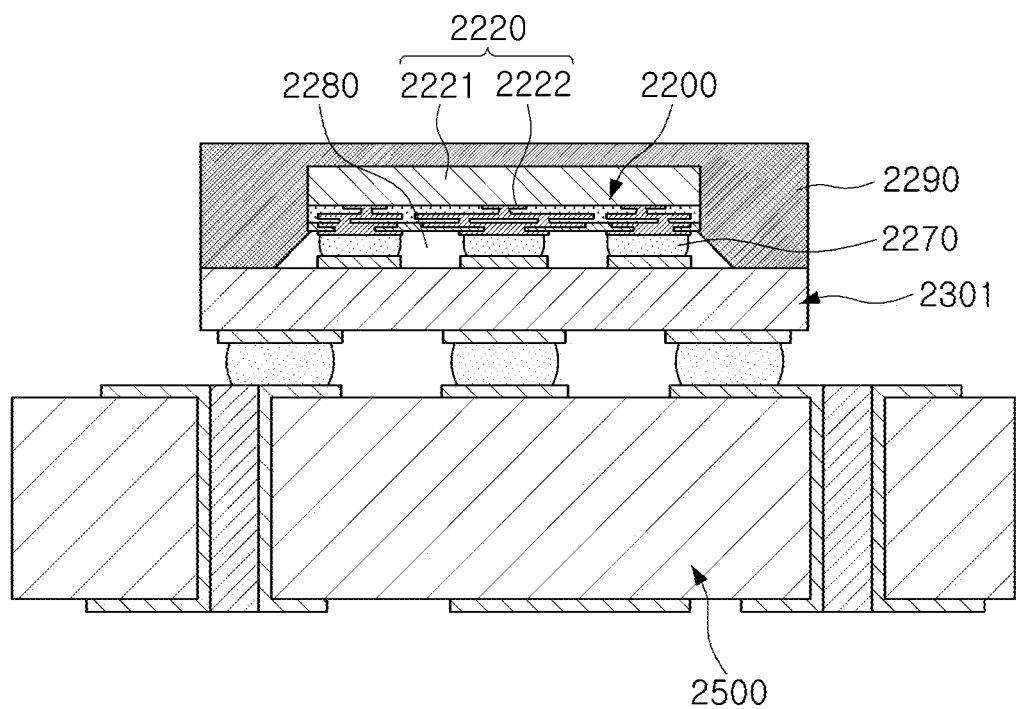
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
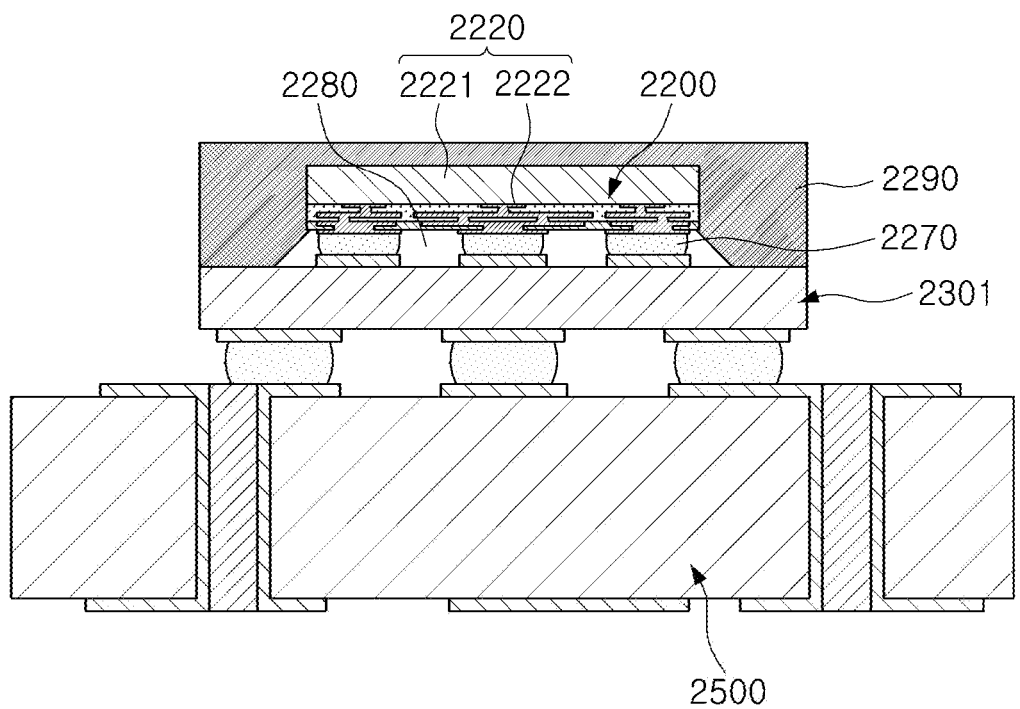
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-out Semiconductor Package

Figure 7:
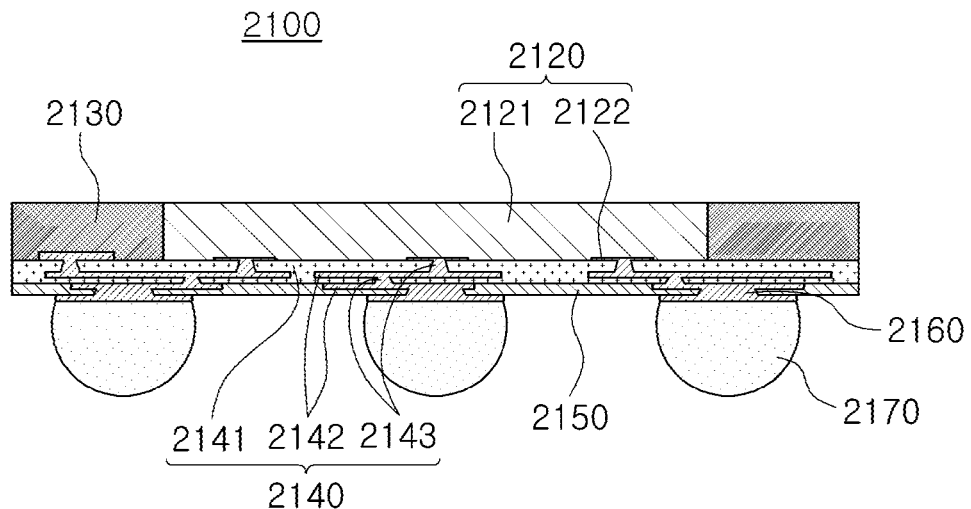
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
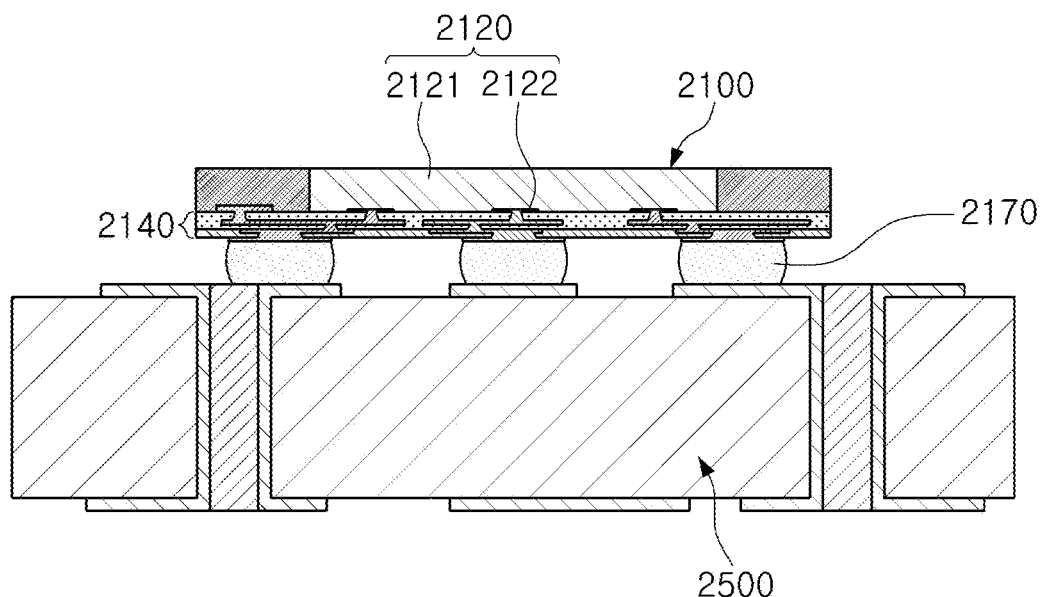
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

Package-on-Package (PoP)

Figure 9:
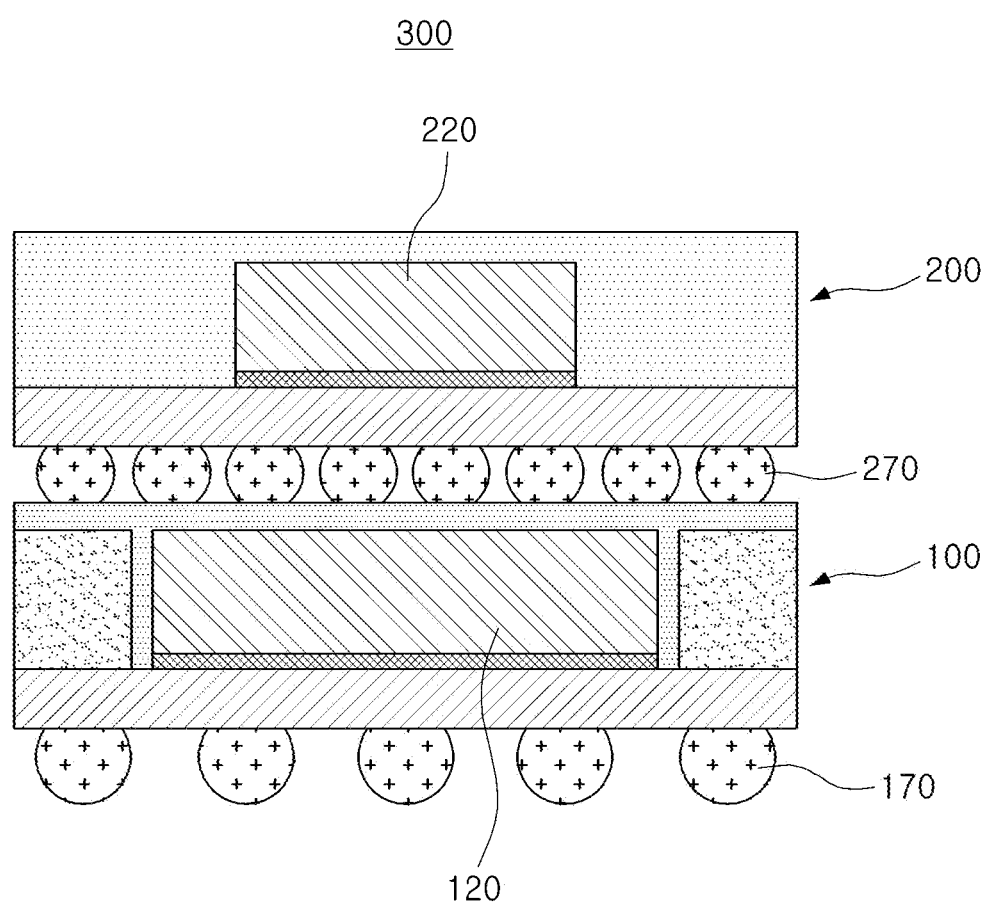
FIG. 9 is a schematic cross-sectional view illustrating an example of a package-on-package (PoP)

FIG. 9 is a schematic cross-sectional view illustrating an example of a package-on-package (PoP), and FIG. is a schematic plan view illustrating arrangement of respective units of first and second semiconductor chips applied to the package-on-package (PoP) in FIG. 9.

Figure 10:
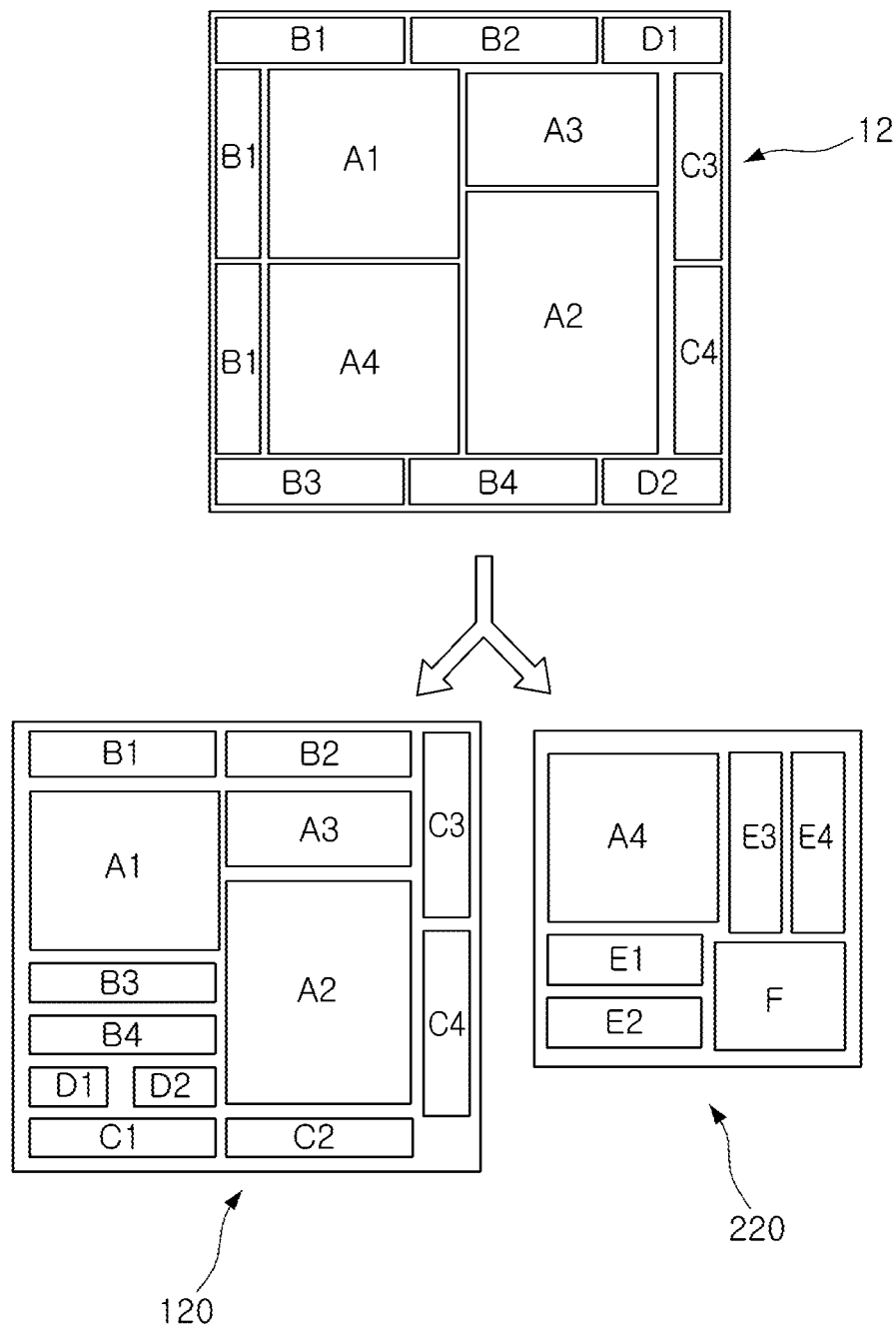
FIG. 10 is a schematic plan view illustrating arrangement of respective units of first and second semiconductor chips applied to the package-on-package (PoP) in FIG. 9.

Referring to FIGS. 9 and 10, a package-on-package (PoP) 300 according to an example embodiment includes a first semiconductor package 100 including a first semiconductor chip 120, and a second semiconductor package 200 including a second semiconductor chip 220 and disposed on the first semiconductor package 100 and electrically connected to the first semiconductor chip 120. The package-on-package (PoP) 300, having such a structure, may be mounted on a printed circuit board (PCB), such a mainboard, using a first electrical connection metal 170. The first semiconductor package 100 and the second semiconductor package 200 may be physically/electrically connected via a second electrical connection metal 270. Detail configurations of the packages 100 and 200 will be described later in detail with reference to accompanying drawings.

Each of the first and second semiconductor chips 120 and 220 may include one or more units A1 to A4, B1 to B4, C1 to C4, D1 and D2, A4, E1 to E4, or F. The number of the units A1 to A3, B1 to B4, C1 to C4, and D1 and D2 of the first semiconductor chip 120 may be greater than the number of the units A4, E1 to E4, and F of the second semiconductor chip 220. The units A1 to A3, B1 to B4, C1 to C4, D1 and D2, A4, E1 to E4, and F of the first and second semiconductor chips 120 and 220 may implement a function of at least one application processor chip. As necessary, the units A1 to A3, B1 to B4, C1 to C4, D1 and D2, A4, E1 to E4, and F may be electrically connected to each other.

For example, as illustrated in FIG. 10, the application processor chip 120 may include core units A1 to A3, interface units B1 to B4, memory units C1 to C4, general-purpose input/output units D1 and D2. The core units A1 to A4 may be, for example, a central processing unit (CPU), a graphics processing unit (GPU), a digital signal processing unit (DSPU) (for example, a digital signal processor (DSP)), an image signal processing unit (ISPU) (for example, an image processor, an image signal processor, or an image processing engine), a neural processing unit (NPU) (or a neural processor), and the like.

In the package-on-package (PoP) 300, the first semiconductor chip 120 includes most units A1 to A3 among the core units A1 to A4, and the second semiconductor chip 220 includes the other unit A4 among the core units A1 to A4. The core units A1 to A3, included in the first semiconductor chip 120, may be, for example, a central processing unit (CPU), a graphics processing unit (GPU), and/or a digital signal processing unit (DSPU). The core unit A4, included in the second semiconductor chip 220, may be, for example, an image processing unit (ISPU) and/or a neural processing unit (NPU). As necessary, the second semiconductor chip 220 may further include additional units E1 to E4 and F. The additional units E1 to E4 and F may be interface units or input/output units, but are not limited thereto.

According to a separation design, the first semiconductor chip 120 may not include the core unit A4 included in the second semiconductor chip 220. For example, the first semiconductor chip 120 may not include the image signal processing unit (ISPU) and/or the neural processing unit (NPU) included in the second semiconductor chip 220. When the semiconductor chip 220 includes only an image signal processing unit (ISPU) as the core unit A4, the first semiconductor chip 120 may include a neural processing unit (NPU). When the second semiconductor chip 220 includes only a neural processing unit (NPU) as the core unit A4, the first semiconductor chip 120 may include an image signal processing unit (ISPU).

As described above, when the specific unit A4, included in the application processor chip 12, is separated to be implemented as a separate semiconductor chip 220, a function of the corresponding unit A4 may be enhanced. For example, when the unit A4, separated to be included in the second semiconductor chip 220, is an image signal processing unit (ISPU), a camera function of a mobile device, such as resolution, may be enhanced. When the unit A4, separated to be included in the second semiconductor chip 220, is a neural processing unit (NPU), an artificial intelligence (AI) function of a mobile device, such as an AI function for speech recognition and/or image recognition, may be enhanced. Both the enhanced camera function and the enhanced AI function may be combined with each other.

The second semiconductor chip 220 is designed by separating the specific unit A4, and may have a size smaller than a size of the first semiconductor chip 210. For example, when viewed from above (or in a plan view), the first semiconductor chip 120 may have a size larger than the size of the second semiconductor chip 220. As necessary, the second semiconductor chip 220 may use the memory units C1 to C4, included in the first memory chip 210, without including an additional memory unit. For example, at least one of the units A4, E1 to E4, and F, included in the second semiconductor chip 220, may be electrically connected to the memory units C1 to C4 included in the first semiconductor chip 210. As necessary, to decrease the number of input/output terminals of the package-on-package (PoP) 300, the second semiconductor chip 220 may not include or may include a minimum number of input/output units for electrical connection to a dynamic random access memory (DRAM). Instead, the second semiconductor chip 220 may be electrically connected to the DRAM using a path via the first semiconductor chip 120. As a result, the package-on-package (PoP) 300 may be designed to be more compact.

Figure 11:
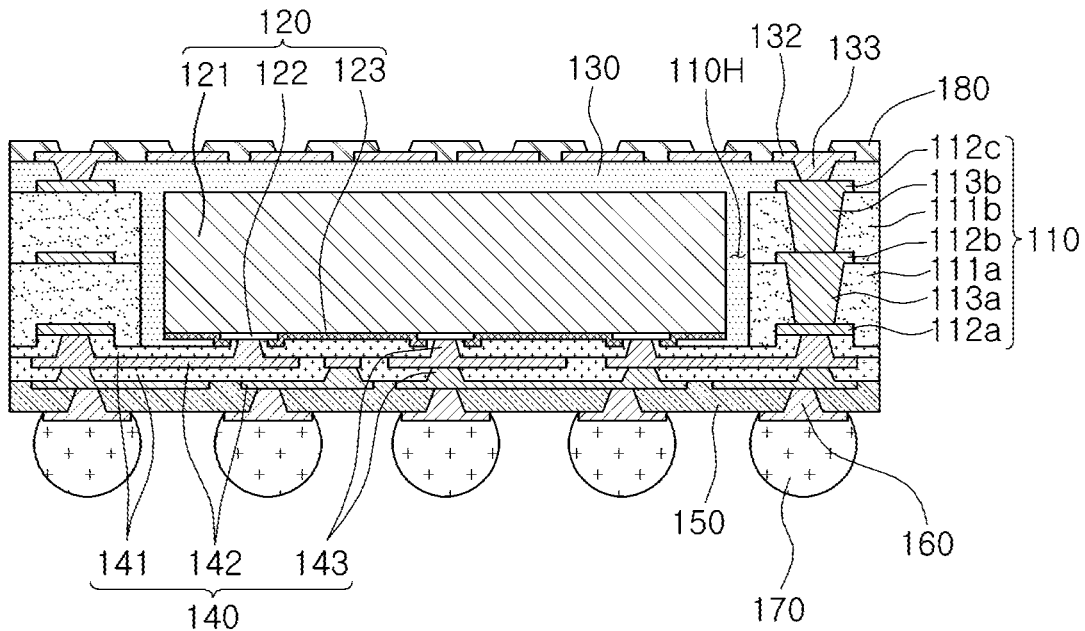
FIG. 11 is a schematic cross-sectional view illustrating an example of a first semiconductor package applied to the package-on-package (PoP) in FIG. 9.

FIG. 11 is a schematic cross-sectional view illustrating an example of a first semiconductor package applied to the package-on-package (PoP) 300 in FIG. 9.

Referring to FIG. 11, a first semiconductor package 100A according to an example embodiment includes a frame 110 having a penetration portion 110H and including one or more wiring layers 112a, 112b, and 112c, a first semiconductor chip 120, disposed in the penetration portion 110H of the frame 110, having a first connection pad 122, a first encapsulant 130 covering at least a portion of each of the frame 110 and the first semiconductor chip 120, a backside wiring layer 132 disposed on an upper side of the first encapsulant 130, a backside via 133 penetrating through the first encapsulant 130 and electrically connecting the backside wiring layer 132 and the one or more wiring layers 112a, 112b, and 112c to each other, a first connection structure 140, disposed on lower sides of the frame 110 and the first semiconductor chip 120, including one or more first redistribution layers 142 electrically connected to the one or more wiring layers 112a, 112b, and 112c and the first connection pad 122, a first passivation layer 150, disposed on a lower side of the first connection structure 140, having an opening exposing at least a portion of the one or more first redistribution layers 142, a first underbump metal 160 disposed on the opening of the first passivation layer to be electrically connected to the exposed first redistribution layer 142, a first electrical connection metal 170 disposed on a lower side of the first passivation layer 150 and electrically connected to the exposed first redistribution layer 142 through the first underbump metal 160, and a cover layer 180, disposed on an upper side of the first encapsulant 130, having an opening exposing at least a portion of the backside wiring layer 132.

The frame 110 may further improve rigidity of the package 100A depending on a specific material of the insulating layers 111a and 111b, and may serve to secure thickness uniformity of the first encapsulant 130, or the like. The frame 110 may have the penetration portion 110H penetrating through the insulating layers 111a and 111b. In the penetration portion 110H, the first semiconductor chip 120 is disposed and, as necessary, a passive component, not illustrated, may be disposed together. The penetration portion 110H may have a wall surface surrounding the first semiconductor chip 120, but a shape of the penetration portion 110H is not limited thereto. The frame 110 may include the wiring layers 112a, 112b, and 112c and the wiring vias 113a and 113b in addition to the insulating layers 111a and 111b, and thus may serve as an electrical connection member providing a vertical electrical connection path. As necessary, another type of electric connection member such as a metal post, providing a vertical electrical connection path, may be introduced as the frame 110.

In an example, the frame 110 includes a first insulating layer 111a, a first wiring layer 112a embedded in the first insulating layer 111a while being in contact with the first connection structure 140, a second wiring layer 112b disposed on a side opposing a side in which the first wiring layer 112a of the first insulating layer 111a is embedded, a second insulating layer 111b, disposed on a side opposing the side in which the first wiring layer 112a of the first insulating layer 111a is embedded, covering at least a portion of the second wiring layer 112b, and a third wiring layer 112c disposed on a side opposing a side in which the second wiring layer 112b of the second insulating layer 111b is embedded. The first and second wiring layers 112a and 112b and the second and third wiring layers 112b and 112c are electrically connected to the first and second wiring vias 113a and 113b, penetrating the first and second insulating layers 111a and 111b, respectively. The first to third wiring layers 112a, 112b, and 112c may be electrically connected to the first connection pad 122 through the first redistribution layer 142 and the first connection via 143 of the first connection structure 140, depending on functions thereof.

A material of the insulating layers 111a and 111b is not limited. For example, an insulating material may be used as a material of the insulating layers 111a and 111b. The insulating material may be a thermosetting resin such as an epoxy resin, a thermoplastic resin such as a polyimide resin, a resin in which the thermosetting resin or the thermoplastic resin is mixed with an inorganic filler, for example, Ajinomoto Build-up Film (ABF), or the like. Alternatively, the insulating material may be a material impregnated together with an inorganic filler in a core material such as a glass fiber (or a glass cloth or a glass fabric), for example, prepreg, or the like.

The wiring layers 112a, 112b, and 112c may provide a vertical electrical connection path of the package 100A together with the wiring vias 113a and 113b, and may serve to redistribute the first connection pad 122. A material of the wiring layers 112a, 112b, and 112c may be a metal such as copper (Cu), aluminum (Al), silver (Ag), tin (Sn), gold (Au), nickel (Ni), lead (Pb), titanium (Ti), or alloys thereof. The wiring layers 112a, 112b, and 112c may perform various functions depending on a design of a corresponding layer. For example, the wiring layers 112a, 112b, and 112c may include a ground (GND) pattern, a power (PWR) pattern, a signal (S') pattern, and the like. The signal (S') pattern includes various signals, for example, a data signal, and the like, except for the ground (GND) pattern, the power (PWR) pattern, and the like. The ground (GND) pattern and the power (PWR) pattern may be identical to each other. The wiring layers 112a, 112b, and 112c may include various types of via pad. The wiring layers 112a, 112b, and 112c may be formed by a known plating process, and may include a seed layer and a plating layer, respectively. For example, not only the third wiring layers 112c, the uppermost wiring layer 112c, but also the first and second wiring layers 112a and 112b may include a seed layer and a plating layer, respectively.

Each of the wiring layers 112a, 112b, and 112c may have a thickness greater than a thickness of the redistribution layer 142. More specifically, the frame 110 may have a thickness greater than or equal to a thickness of the first semiconductor chip 120. Since prepreg, or the like, may be selected as a material of the insulating layers 111a and 111b to maintain rigidity of the insulating layers 111a and 111b, each of the wiring layers 112a, 112b, and 112c may also have a relatively great thickness. Meanwhile, since the first connection structure 140 requires a fine circuit and a high-density design, and thus, a photoimageable dielectric (PID)

or the like is selected as a material of the insulating layer 141, the redistribution layer 142 may also have a relatively small thickness.

The first wiring layer 112a may be recessed into the first insulating layer 111a. The first wiring layer 112a is recessed into the first insulating layer 111a to form a step between a surface, disposed in contact with the first connection structure 140, of the first insulating layer 111a, and a surface, disposed in contact with the first connection structure 140 of, the first wiring layer 112a. In this case, when the first semiconductor chip 120 and the frame 110 are encapsulated by the encapsulant 130, bleeding of the material of the encapsulant 130 may be suppressed to prevent the first wiring layer 112a from being contaminated by the material of the encapsulant 130.

The wiring via 113a, 113b, and 113c electrically connect the wiring layers 112a, 112b, and 112c, disposed on different layers, to form an electrical connection path in the first frame 110. A material of the wiring vias 113a and 113b may be a metal material such as copper (Cu), aluminum (Al), silver (Ag), tin (Sn), gold (Au), nickel (Ni), lead (Pb), titanium (Ti), or alloys thereof. The wiring vias 113a and 113b may include a via for signals, a via for power, a via for grounding, or the like, and the via for power and the via for grounding may be identical to each other. Each of the connection vias 113a and 113b may be a filled-type via filled with a metal material, or a conformal-type via in which a metal material is formed along a wall surface of a via hole. Moreover, each of the connection vias 113a and 113v may have a tapered shape. The connection vias 113a and 113b may also be formed by a plating process, and may include a seed layer and a plating layer.

When a hole for the first wiring via layer 113a is formed, some pads of the first wiring layer 112a may serve as a stopper. Accordingly, it is advantageous in process that the first wiring via 113a has a tapered shape in which an upper side has a width greater than a width of a lower side. In this case, the first wiring via 113a may be integrated with a pad pattern of the second wiring layer 112b. Similarly, when a hole for the second wiring via layer 113b is formed, some pad of the second wiring layer 112b may serve as a stopper. Accordingly, it is advantageous in process that the second wiring via 113b has a tapered shape in which an upper side has a greater smaller than a width of a lower side. In this case, the second wiring via 113b may be integrated with a pad pattern of the third wiring layer 112c.

As necessary, a metal, not illustrated, may be disposed on a wall surface of the penetration portion 110H of the frame 110 to shield electromagnetic interference or dissipate heat. The metal layer, not illustrated, may surround the first semiconductor chip 120.

The first semiconductor chip 120 may be an integrated circuit (IC) in a bare state in which an additional bump or wiring layer is not formed, but is not limited thereto. As necessary, the first semiconductor chip 120 may be a packaged-type integrated circuit. The first semiconductor chip 120 may be an IC formed based on an active wafer. In this case, a base material of a body 121 may be silicon (Si), germanium (Ge), gallium arsenide (GaAs), or the like. Various circuits may be formed on the body 121. The first connection pad 122 may electrically connect the first semiconductor chip 120 to other components. A material of the first connection pad 122 may be a metal such as aluminum (Al) or the like, but is not limited thereto. A passivation layer 123 may be disposed on the body 121 to expose the first connection pads 122, and may be an oxide layer, a nitride layer, or the like. Alternatively, the passivation layer 123 may be a double layer of an oxide layer and a nitride layer. The first semiconductor chip 120 has an active surface, on which the first connection pad 122 is disposed, and an inactive surface, which is a back surface opposing the active surface. In some cases, a connection pad may also be disposed on a back surface, so that both surfaces may be active surfaces. As an example, when the passivation layer 123 is disposed on an active surface of the first semiconductor chip 120, a positional relationship of the active surface of the first semiconductor chip 120 is determined on the basis of a lowermost surface of the passivation layer 123.

The encapsulant 130 covers the first semiconductor chip 120 and at least a portion of the frame 110, and fills at least a portion of the penetration portion 110H. The first encapsulant 130 includes an insulating material such as a non-photoimageable dielectric. More specifically, the insulting material of the first encapsulant 130 may be a non-photoimageable dielectric including an inorganic filler and an insulating resin, for example, a thermosetting resin such as an epoxy resin, a thermoplastic resin such as a polyimide resin, a resin having a reinforcing material, such as an inorganic filler impregnated in the thermosetting resin and the thermoplastic resin such as ABF, or a non-photoimageable dielectric such as MEC. As necessary, a material in which a thermosetting resin or a thermoplastic resin is impregnated with an inorganic filler and/or a core material such as a glass fiber may also be used as the insulating material. Accordingly, voids or undulation may be prevented, and warpage may be controlled more easily. As necessary, a photoimageable encapsulant (PIE) may be used as the insulating material.

The backside wiring layer 132 is disposed on the first encapsulant 130 to provide a backside circuit to the package 100A together with the backside via 133. The backside wiring layer 132 may also include a metal such as copper (Cu), aluminum (Al), silver (Ag), tin (Sn), gold (Au), nickel (Ni), lead (Pb), titanium (Ti), or alloys thereof. The backside wiring layer 132 may perform various functions depending on a design. For example, the backside wiring layer 132 may include a ground (GND) pattern, a power (PWR) pattern, a signal (S') pattern, and the like. The signal (S') pattern includes various signals, for example, a data signal, and the like, except for the ground (GND) pattern, the power (PWR) pattern, and the like. The ground (GND) pattern and the power (PWR) pattern may be identical to each other. The backside wiring layer 132 may be formed by a known plating process, and may include a seed layer and a conductor layer.

The backside via 133 penetrates through the encapsulant 130, and electrically connects the metal pattern layer 132 to the third wiring layer 112c, the uppermost wiring layer 112c. The backside via 133 may also include a metal such as copper (Cu), aluminum (Al), silver (Ag), tin (Sn), gold (Au), nickel (Ni), lead (Pb), titanium (Ti), or alloys thereof. The backside via 133 may be a filled-type via filled with a metal material, or a conformal-type via in which a metal material is formed along a wall surface of a via hole. The backside via 133 may have a tapered shape of the same direction as the wiring vias 113a and 113b. The backside via 133 may also include a via for signals, a via for power, a via for grounding, or the like, and the via for power and the via for grounding may be identical to each other. The backside via 133 may also be formed by a known plating process, and may include a seed layer and a plating layer.

The first connection structure 140 may redistribute the first connection pad 122 of the first semiconductor chip 120. Several tens to several hundreds of first connection pads 122, having various functions, may be redistributed through the first connection structure 140 and may be physically and/or electrically connected through the first electrical connection metal 170 depending on the functions thereof. The first connection structure 140 includes a first insulating layer 141, a first redistribution layer 142, disposed on a bottom surface of the first insulating layer 141, and a first connection via 143, penetrating through the first insulating layer 141, electrically connected to the first redistribution layer 142. The first insulating layer 141, the first redistribution layer 142, and first the connection vias 143 may include a larger number of layers than those illustrated in the drawings, or a smaller number of layers than those illustrated in the drawings. For example, the number of layers may vary depending on design.

A material of the first insulating layer 141 may be an insulating material such as a photoimageable dielectric (PID). In this case, a fine pitch may be introduced through a photo via, which is advantageous in fine circuit and high-density design and allows several tens to several millions of connection pads 122 of the first semiconductor chip 120 to be effectively redistributed. Boundaries between the first insulating layers 141 may be apparent or may not be readily apparent.

The first redistribution layer 142 may redistribute the first connection pad 122 of the first semiconductor chip 120 to electrically connect the connection pad 122 to the first electrical connection metal 170. A material of the first redistribution layer 142 may also be a metal such as copper (Cu), aluminum (Al), silver (Ag), tin (Sn), gold (Au), nickel (Ni), lead (Pb), titanium (Ti), or alloys thereof. The first redistribution layer 142 may also perform various functions depending on a design. For example, the first redistribution layer 142 may include a ground (GND) pattern, a power (PWR) pattern, a signal (S') pattern, and the like. The ground (GND) pattern and the power (PWR) pattern may be identical to each other. The first redistribution layer 142 may include various types of via pad, electrical connection metal pad, and the like. The first redistribution layer 142 may be formed by a plating process, and may include a seed layer and a conductor layer.

The first connection via 143 electrically connects first redistribution layers 142, disposed on different layers, to each other and electrically connects the first connection pad 122 of the first semiconductor chip 120 and the first wiring layer 112a of the frame 110 to the first redistribution layer 142. The first connection via 143 may be in physical contact with the connection pad 122 when the first semiconductor chip 120 is a bare die. A material of the first redistribution layer 142 may also be a metal such as copper (Cu), aluminum (Al), silver (Ag), tin (Sn), gold (Au), nickel (Ni), lead (Pb), titanium (Ti), or alloys thereof. The first connection via 143 may include a via for signals, a via for power, a via for grounding, or the like, and the via for power and the via for grounding may be identical to each other. The first connection via 143 may also be a filled-type via filled with a metal material, or a conformal-type via in which a metal material is formed along a wall surface of a via hole. Moreover, the first connection via 143 may have a tapered shape of a direction opposite to a direction of the wiring vias 113a and 113b. The first connection via 143 may also be formed by a plating process, and may include a seed layer and a conductor layer.

The first passivation layer 150 is additionally configured to protect the first connection structure 140 from external physical and chemical damage and the like. The first passivation layer 150 may include a thermosetting resin. For example, the first passivation layer 150 may be ABF, but is not limited thereto. The first passivation layer 150 has an opening exposing at least a portion of the lowermost redistribution layer 142 of the first redistribution layer 142. There may be several tens to several tens of thousands of openings, and the passivation layer 150 may be provided with a larger or smaller number of openings. Each of the openings may include a plurality of holes. As necessary, a surface-mount component such as a capacitor may be disposed on a bottom surface of the first passivation layer 150 to electrically connect the first passivation layer 150 to the first redistribution layer 142. As a result, the surface-mount component may also be electrically connected to the first semiconductor chip 120.

The first underbump metal 160 may also be additionally configured to improve connection reliability of the electrical first connection metal 170 and to improve board level reliability of the fan-out semiconductor package 100A according to an example embodiment. There may be several tens to several millions of first underbump metals 160, and a larger or smaller number of first underbump metals 160 may be provided. Each first underbump metal 160 may be disposed in the opening of the first passivation layer 150 to be electrically connected to the exposed lowermost first redistribution layer 142. The first underbump metal 160 may be formed by a known metallization method using a metal, but is not limited thereto.

The first electrical connection metal 170 is also additionally configured to physically and/or electrically connect the semiconductor package 100A to an external component. For example, the semiconductor package 100A may be mounted on a mainboard of an electronic device through the first electrical connection metal 170. The first electrical connection metal 170 may be disposed on an upper side of the passivation layer 150 and may be electrically connected to the first underbump metal 160. Each first electrical connection metal 170 may include a low melting point metal such as tin (Sn) or a Sn-containing alloy. More specifically, each first electrical connection metal 170 may be formed of a solder or the like, but is merely an example and a material thereof is not limited thereto.

The first electrical connection metal 170 may be a land, a ball, a pin, or the like. The first electrical connection metal 170 may be formed as a multilayer structure or a single-layer structure. When the first electrical connection metal 170 is formed as a multilayer structure, the electrical first connection metal 170 may include a copper (Cu) pillar and a solder. When the first electrical connection metal 170 is formed as a single-layer structure, the first electrical connection metal 170 may include a tin-silver solder or copper (Cu). However, these are also merely examples, and a structure and a material of the first electrical connection metal 170 are not limited thereto. The number, an interval, a dispositional form, and the like, of the first electrical connection metal 170 are not limited, but may be sufficiently modified depending on design by those skilled in the art. For example, several tens to several tens of thousands of first electrical connection metals 170 may be provided according to the number of first connection pads 122, and a greater or smaller number of first electrical connection metals 170 may be provided.

At least one of the first electrical connection metals 170 is disposed in a fan-out region. The term "fan-out region" refers to a region except for a region in which the first semiconductor chip 120 is disposed. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

The cover layer 180 is additionally configured to protect the backside wiring layer 132 from external physical and chemical damage and the like. The cover layer 180 may include a thermosetting resin. For example, the cover layer 180 may be an ABF, but is not limited thereto. The cover layer 180 has an opening exposing at least a portion of the backside wiring layer 132. There may be several tens to several tens of thousands of openings, and the cover layer 180 may be provided with a larger or smaller number of openings. Each of the openings may include a plurality of holes.

Figure 12:
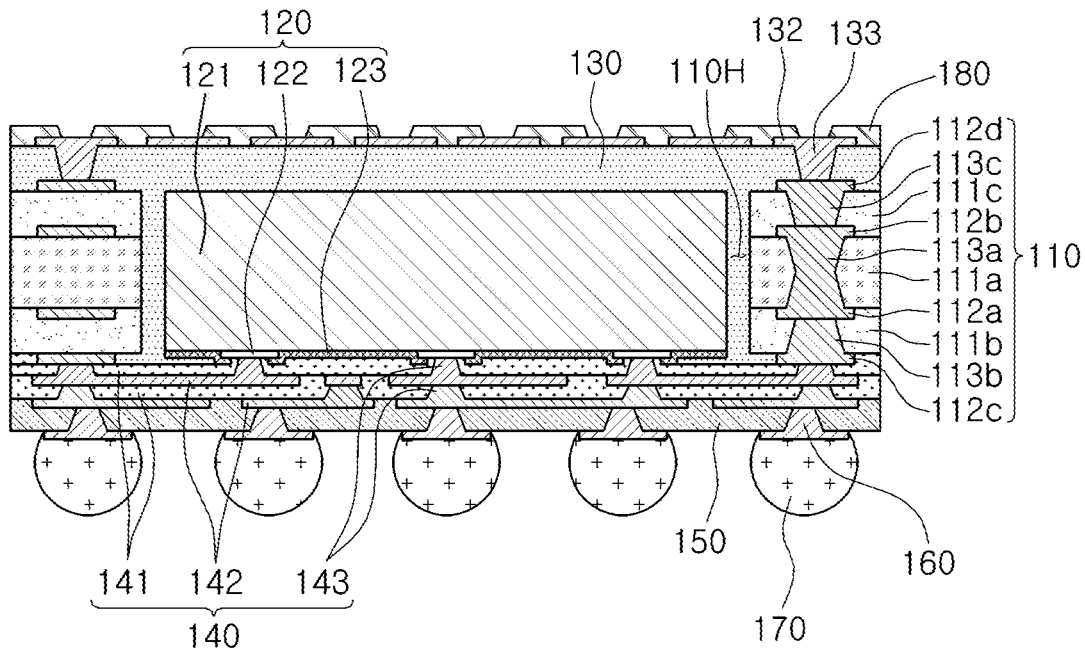
FIG. 12 is a schematic cross-sectional view illustrating another example of the first semiconductor package applied to the package-on-package (PoP) in FIG. 9.

FIG. 12 is a schematic cross-sectional view illustrating another example of the first semiconductor package applied to the package-on-package (PoP) in FIG. 9.

Referring to FIG. 12, a semiconductor package 100B according to another example embodiment includes a frame 110 having a structure different from the structure of the frame 110 of the above-described first semiconductor package 100A. More specifically, the frame 110 includes a first insulating layer 111a, a first wiring layer 112a and a second wiring layer 112b respectively disposed on both surfaces of the first insulating layer 111a, a second insulating layer 111b and the third insulating layer 111c, respectively disposed on both surfaces of the first insulating layer 111a, respectively covering the first and second wiring layers 112a and 112b, a third wiring layer 112c disposed on a side opposing a side in which the first wiring layer 112a of the second insulating layer 111b is embedded, a fourth wiring layer 112d disposed on a side opposing a side in which the second wiring layer 112b of the third insulating layer 111c is embedded, a first wiring via 113a penetrating through the first insulating layer 111a and electrically connecting the first and second wiring layers 112a and 112b to each other, a second wiring via 112b penetrating the second insulating layer 111b and electrically connecting the first and third wiring layers 112a and 113c to each other, and a third wiring via penetrating the third insulating layer 111c and electrically connecting the second and fourth wiring layers 112b and 112d to each other. Since the frame 1110 includes a greater number of wiring layers 112a, 112b, 112c, and 112d, the first connection structure 140 may be further simplified.

The first insulating layer 111a may have a thickness greater than a thickness of the second insulating layer 111b and a thickness of the third insulating layer 111c. The first insulating layer 111a may have a relatively great thickness to maintain rigidity, and the second and third insulating layers 111b and 111c may be introduced to form a greater number of wiring layers 112c and 112d. From a similar point of view, the first wiring via 113a penetrating through the first insulating layer 111a may have an average diameter and a height greater than an average diameter and a height of each of the second and third wiring vias 113b and 113c penetrating through the second and third insulating layers 111b and 111c. The first wiring 113a may have an hourglass shape or a cylindrical shape, and the second and third wiring vias 113b and 113c may have tapered shapes of opposite directions. Each of the wiring layers 112a, 112b, 112c, and 112d may have a thickness greater than a thickness of a first redistribution layer 142.

The other descriptions are substantially the same as the detailed description of the first semiconductor package 100A according to an example embodiment, and will be omitted herein.

Figure 13:
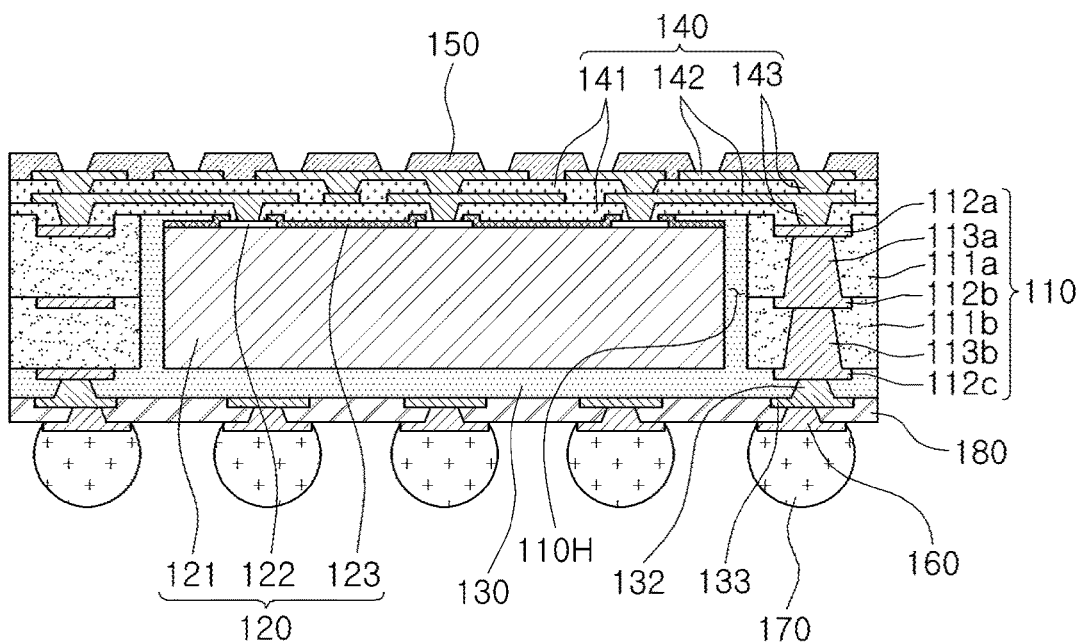
FIG. 13 is a schematic cross-sectional view illustrating another example of the first semiconductor package applied to the package-on-package (PoP) in FIG. 9.

FIG. 13 is a schematic cross-sectional view illustrating another example of the first semiconductor package applied to the package-on-package (PoP) in FIG. 9.

Referring to FIG. 13, a first semiconductor package 100C according to another example embodiment includes a first semiconductor chip 120 disposed in a face-up orientation, rather than a face-down orientation, in the above-described first semiconductor package 100A. Accordingly, a first connection structure 140 and a first passivation layer 150 are disposed on an upper side of the first semiconductor package 110C rather than a lower side thereof. In addition, a backside wiring layer 132, a backside via 133, and a cover layer 180 are disposed on a lower side of the first semiconductor package 100C rather than an upper side thereof. A first underbump metal 160 is connected to the backside wiring layer 132 disposed and exposed in an opening formed in the cover layer 180. A first electrical connection metal 170 is disposed on a lower side of the cover layer 180 to be electrically connected to the exposed backside wiring layer 132 through the first underbump metal 160. In such a structure, an electrical connection path between the first semiconductor chip 120 and the above-mentioned second semiconductor chip 220 may be significantly reduced to implement improved performance.

The other descriptions are substantially the same as the detailed description of the first semiconductor package 100A according to an example embodiment, and will be omitted herein.

Figure 14:
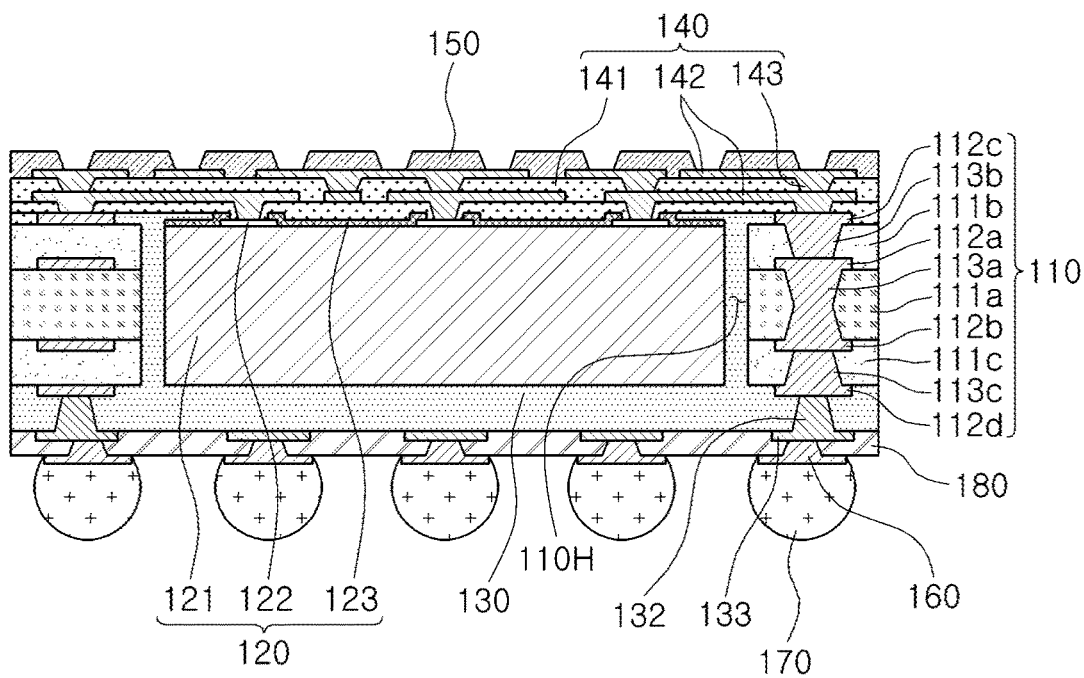
FIG. 14 is a schematic cross-sectional view illustrating another example of the first semiconductor package applied to the package-on-package (PoP) in FIG. 9.

FIG. 14 is a schematic cross-sectional view illustrating another example of the first semiconductor package applied to the package-on-package (PoP) in FIG. 9.

Referring to FIG. 14, a first semiconductor package 100D according to another example embodiment includes a first semiconductor chip 120 disposed in a face-up orientation, rather than a face-down orientation, in the above-described first semiconductor package 100B. Accordingly, a first connection structure 140 and a first passivation layer 150 are also disposed on an upper side of the first semiconductor 100D, rather than a lower side thereof. In addition, a backside wiring layer 132, a backside via 133, and a cover layer 180 are disposed on a lower side of the first semiconductor package 100D, rather than an upper side thereof. A first underbump metal 160 is connected to the backside wiring layer 132 disposed and exposed in an opening formed in the cover layer 180. A first electrical connection metal 170 is disposed on a lower side of the cover layer 180 to be electrically connected to the exposed backside wiring layer 132 through the first underbump metal 160. In such a structure, an electrical connection path between the first semiconductor chip 120 and the above-mentioned second semiconductor chip 220 may be significantly reduced to implement improved performance.

The other descriptions are substantially the same as the detailed description of the first semiconductor packages 100A and 100B according to an example embodiment, and will be omitted herein.

Figure 15:
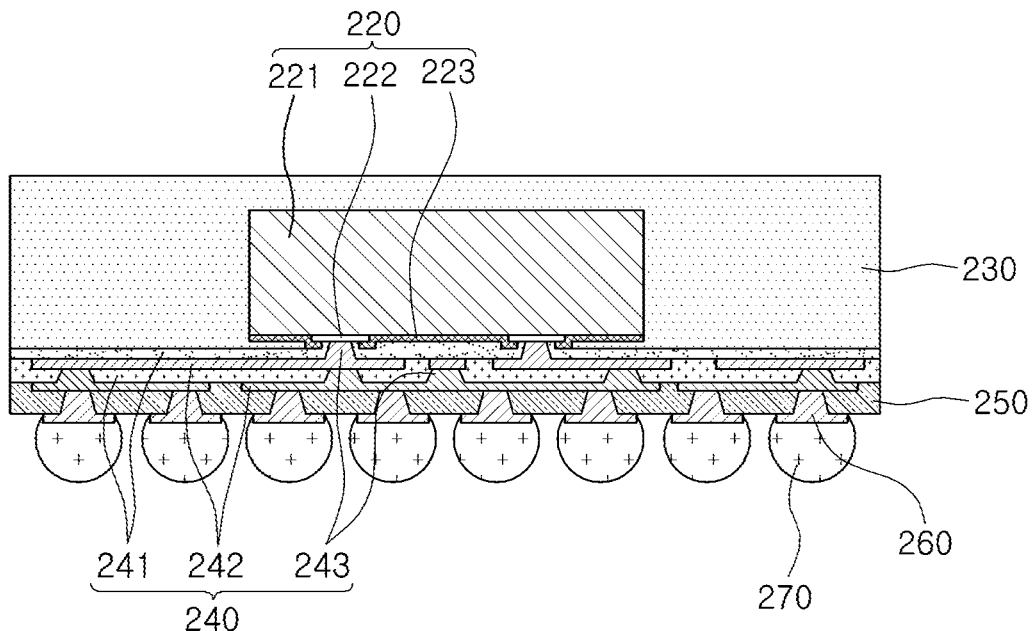
FIG. 15 is a schematic cross-sectional view illustrating an example of a second semiconductor package applied to the package-on-package (PoP) in FIG. 9.

FIG. 15 is a schematic cross-sectional view illustrating an example of a second semiconductor package applied to the package-on-package (PoP) in FIG. 9.

Referring to FIG. 15, a second semiconductor package 200A according to an example embodiment includes a second semiconductor chip 220 having a second connection pad 222, a second encapsulant 230 covering at least a portion of the second semiconductor chip 220, a second connection structure 240, disposed on a lower side of the second semiconductor chip 220, including one or more second redistribution layers 242 electrically connected to the second connection pad 222, a second passivation layer 250, disposed on a lower side of the second connection structure 240, having an opening exposing at least a portion of the one or more second redistribution layers 242, a second underbump metal 260 disposed on the opening of the second passivation layer 250 to be electrically connected to the exposed second redistribution layer 242, and a second electrical connection metal 270 disposed on a lower side of the second passivation layer 250 and electrically connected to the exposed second redistribution layer 242 through the second underbump metal 260.

The second semiconductor chip 220 may be an integrated circuit (IC) in which hundreds to millions of or more devices are integrated in a single chip. An integrated circuit, constituting the second semiconductor chip 220, may include, for example, an a separate chip formed by separating some units from an application processor chip, as described above, but is not limited thereto. The second semiconductor chip 220 may be an integrated circuit in a bare state in which an additional bump or wiring layer is not formed, but is not limited thereto. As necessary, the second semiconductor chip 220 may be a packaged-type integrated circuit. The integrated circuit may be formed based on an active wafer. In this case, a base material of a body 221 of the second semiconductor chip 220 may be silicon (Si), germanium (Ge), gallium arsenide (GaAs), or the like. Various circuits may be formed on the body 121. The second connection pad 222 may electrically connect the second semiconductor chip 220 to other components. A material of the second connection pad 222 may be a metal such as copper (Cu), aluminum (Al), or the like, but is not limited thereto. A passivation layer 223 may be disposed on the body 221 to expose the second connection pads 222, and may be an oxide layer, a nitride layer, or the like. Alternatively, the passivation layer 223 may be a double layer of an oxide layer and a nitride layer. The second semiconductor chip 220 has an active surface, on which the second connection pad 222 is disposed, and an inactive surface, which is a back surface opposing the active surface. In some cases, a connection pad may also be disposed on a back surface, so that both surfaces may be active surfaces. As an example, when the passivation layer 223 is disposed on an active surface of the second semiconductor chip 220, a positional relationship of the active surface of the second semiconductor chip 220 is determined on the basis of a lowermost surface of the passivation layer 223.

The second encapsulant 230 covers a portion of the second semiconductor chip 220. The second encapsulant 230 may include an insulating material. The insulating material may be a non-photoimageable dielectric. More specifically, the insulating material may be a non-photoimagable dielectric including an inorganic filler and an insulating resin, for example, a thermosetting resin such as an epoxy resin, a thermoplastic resin such as a polyimide resin, or a resin having a reinforcing material, such as an inorganic filler impregnated in the thermosetting resin and the thermoplastic resin, in detail, an ABF or a non-photoimageable dielectric such as an epoxy molding compound (EMC). Alternatively, a material, in which a thermosetting resin or a thermoplastic resin is impregnated with an inorganic filler and/or a core material such as a glass fiber, may also be used as the insulating material. Accordingly, voids or undulation may be prevented, and warpage may be controlled more easily. As necessary, a PIE may be used as the insulating material.

The second connection structure 240 may redistribute the second connection pad 222 of the second semiconductor chip 220. Several tens to several hundreds of second connection pads 122, having various functions, may be redistributed through the second connection structure 240 and may be physically and/or electrically connected through the second electrical connection metal 270 depending on the functions thereof. The second connection structure 240 includes a second insulating layer 241, a second redistribution layer 242 disposed on a bottom surface of the second insulating layer 241, and a second connection via 243, penetrating through the second insulating layer 241, connected to the second redistribution layer 242.

The second insulating layer 241, the second redistribution layer 242, and the second connection vias 243 may include a larger number of layers than those illustrated in the drawings, or a smaller number of layers than those illustrated in the drawings. For example, the number of layers may vary depending on design.

A material of the second insulating layer 241 may be an insulating layer such as a photoimageable dielectric (PID). In this case, a fine pitch may be introduced through a photo via, which is advantageous in fine circuit and high-density design and allows several tens to several millions of second connection pads 222 of the second semiconductor chip 220 to be effectively redistributed. Boundaries between the second insulating layers 241 may be apparent or may not be readily apparent.

The second redistribution layer 242 may redistribute the second connection pad 222 of the second semiconductor chip 220 to electrically connect the second connection pad 222 to the second electrical connection metal 270. A material of the second redistribution layer 242 may also be a metal such as copper (Cu), aluminum (Al), silver (Ag), tin (Sn), gold (Au), nickel (Ni), lead (Pb), titanium (Ti), or alloys thereof. The second redistribution layer 242 may also perform various functions depending on a design. For example, the second redistribution layer 242 may include a ground (GND) pattern, a power (PWR) pattern, a signal (S') pattern, and the like. The ground (GND) pattern and the power (PWR) pattern may be identical to each other. The second redistribution layer 242 may include various types of via pad, electrical connection metal pad, and the like. The second redistribution layer 242 may be formed by a plating process, and may include a seed layer and a conductor layer.

The second connection via 243 electrically connects second redistribution layers 242, disposed on different layers, to each other. In addition, the second connection via 243 electrically connects the second connection pad 222 of the second semiconductor chip 220 to the second redistribution layer 242. The second connection via 243 may be in physical contact with the second connection pad 222 when the second semiconductor chip 220 is a bare die. A material of the second connection via 243 may also be a metal such as copper (Cu), aluminum (Al), silver (Ag), tin (Sn), gold (Au), nickel (Ni), lead (Pb), titanium (Ti), or alloys thereof. The connection via 143 may include a via for signals, a via for power, a via for grounding, or the like, and the via for power and the via for grounding may be identical to each other. The second connection via 243 may also be a filled-type via filled with a metal material, or a conformal-type via in which a metal material is formed along a wall surface of a via hole. Moreover, the second connection via 243 may have a tapered shape tapered in a direction from the second connection structure 240 to the second semiconductor chip 220. The second connection via 243 may also be formed by a plating process, and may include a seed layer and a conductor layer.

The second passivation layer 250 may be additionally configured to protect the second connection structure 240 from external physical and chemical damage and the like. The second passivation layer 250 may include a thermosetting resin. For example, the second passivation layer 250 may be ABF, but is not limited thereto. The second passivation layer 250 has an opening exposing at least a portion of the lowermost redistribution layer 242 of the second redistribution layer 242. There may be several tens to several tens of thousands of openings, and the second passivation layer 250 may be provided with a larger or smaller number of openings. Each of the openings may include a plurality of holes. As necessary, a surface-mount component such as a capacitor may be disposed on a bottom surface of the second passivation layer 250 to electrically connect the second passivation layer 250 to the second redistribution layer 242. As a result, the second passivation layer 250 may be electrically connected to the second semiconductor chip 220.

The second underbump metal 260 may also be additionally configured to improve connection reliability of the electrical second connection metal 270 and to improve board level reliability of the second semiconductor package 200A. There may be several tens to several millions of second underbump metals 260, and a larger or smaller number of second underbump metals 260 may be provided. Each second underbump metal 260 may be disposed in the opening of the second passivation layer 250 to be electrically connected to the exposed lowermost second redistribution layer 242. The second underbump metal 260 may be formed by a known metallization method using a metal, but is not limited thereto.

The second electrical connection metal 270 is also additionally configured to physically and/or electrically connect the second semiconductor package 200A to the above-described semiconductor package 100 (100A to 100D). The second electrical connection metal 270 may be disposed on a lower side of the second passivation layer 250, and may be electrically connected to the second underbump metal 260. Each second electrical connection metal 270 may include a low melting point metal such as tin (Sn) or a Sn-containing alloy. More specifically, each second electrical connection metal 270 may be formed of a solder or the like, but is merely an example and a material thereof is not limited thereto.

The second electrical connection metal 270 may be a land, a ball, a pin, or the like. The second electrical connection metal 270 may be formed as a multilayer structure or a single-layer structure. When the second electrical connection metal 270 is formed as a multilayer structure, the second electrical connection metal 270 may include a copper (Cu) pillar and a solder. When the second electrical connection metal 270 is formed as a single-layer structure, the second electrical connection metal 270 may include a tin-silver solder or copper (Cu). However, these are also merely examples, and a structure and a material of the electrical second connection metal 270 are not limited thereto. The number, an interval, a dispositional form, and the like, of the second electrical connection metal 270 are not limited, but may be sufficiently modified depending on design by those skilled in the art. For example, several tens to several tens of thousands of second electrical connection metals 270 may be provided according to the number of second connection pads 222, and a greater or smaller number of second electrical connection metals 270 may be provided.

At least one of the second electrical connection metals 270 is disposed in a fan-out region. The term "fan-out region" refers to a region except for a region in which the second semiconductor chip 220 is disposed. The fan-out package may have improved reliability as compared to a fan-in package, may allow a plurality of input/output (I/O) terminals to be implemented, and may facilitate a three-dimensional (3D) interconnection. Moreover, as compared to a ball grid array (BGA) package, a land grid array (LGA) package, or the like, the fan-out package may be manufactured to have a small thickness, and may be superior in price competitiveness.

Figure 16:
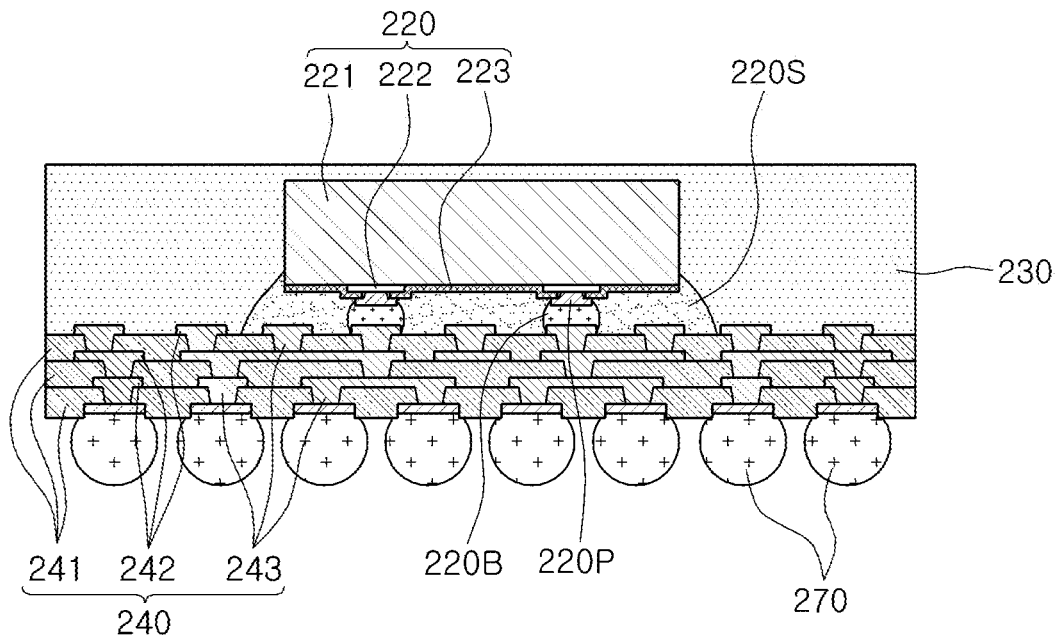
FIG. 16 is a schematic cross-sectional view illustrating another example of the second semiconductor package applied to the package-on-package (PoP) in FIG. 9.

FIG. 16 is a schematic cross-sectional view illustrating another example of the second semiconductor package applied to the package-on-package (PoP) in FIG. 9.

Referring to FIG. 16, a second semiconductor package 200B according to an example embodiment includes a second connection structure 240 provided in the form of an organic interposer. In this case, a second semiconductor chip 220 may be disposed on the second connection structure 240 using a surface-mount technology (SMT). For example, a metal bump 220P, formed by plating a metal such as copper (Cu), may be disposed on a second connection pad 222 of the second semiconductor chip 220. The metal bump 220P may be connected to a pad pattern, protruding to a surface of the second redistribution layer 242 of the second connection structure 240, through a third electrical connection metal 220B such as a solder paste or the like. For example, the second semiconductor chip 220 may be physically spaced apart from the second connection structure 240. In addition, an underfill resin 220S fills a space between the second semiconductor chip 220 and the second connection structure 240 to embed the third electrical connection metal 220B, or the like, and to more tightly fix the second semiconductor chip 220.

The second connection structure 240 may redistribute the second connection pad 222 of the second semiconductor chip 220. Several tens to several hundreds of second connection pads 122, having various functions, may be redistributed through the second connection structure 240 and may be physically and/or electrically connected through the second electrical connection metal 270 depending on the functions thereof. The second connection structure 240 includes a second insulating layer 241, a second redistribution layer 242 disposed on an upper surface of the second insulating layer 241, and a second connection via 243, penetrating through the second insulating layer 241, connected to the second redistribution layer 242. The second insulating layer 241, the second redistribution layer 242, and the second connection vias 243 may include a larger number of layers than those illustrated in the drawings, or a smaller number of layers than those illustrated in the drawings. For example, the number of layers may vary depending on design.

A material of the second insulating layer 241 may be an insulating layer such as a photoimageable dielectric (PID). In this case, a fine pitch may be introduced through a photo via, which is advantageous in fine circuit and high-density design and allows several tens to several millions of second connection pads 222 of the second semiconductor chip 220 to be effectively redistributed. Boundaries between the second insulating layers 241 may be apparent or may not be readily apparent.

The second redistribution layer 242 may redistribute the second connection pad 222 of the second semiconductor chip 220 to electrically connect the second connection pad 222 to the second electrical connection metal 270. A material of the second redistribution layer 242 may also be a metal such as copper (Cu), aluminum (Al), silver (Ag), tin (Sn), gold (Au), nickel (Ni), lead (Pb), titanium (Ti), or alloys thereof. The second redistribution layer 242 may also perform various functions depending on a design. For example, the second redistribution layer 242 may include a ground (GND) pattern, a power (PWR) pattern, a signal (S') pattern, and the like. The ground (GND) pattern and the power (PWR) pattern may be identical to each other. The second redistribution layer 242 may include various types of via pad, electrical connection metal pad, and the like. The second redistribution layer 242 may be formed by a plating process, and may include a seed layer and a conductor layer.

The second connection via 243 electrically connects second redistribution layers 242, disposed on different layers, to each other. In addition, the second connection via 243 electrically connects the second connection pad 222 of the second semiconductor chip 220 to the second redistribution layer 242. The second connection via 243 may be in physical contact with the second connection pad 222 when the second semiconductor chip 220 is a bare die. A material of the second connection via 243 may also be a metal such as copper (Cu), aluminum (Al), silver (Ag), tin (Sn), gold (Au), nickel (Ni), lead (Pb), titanium (Ti), or alloys thereof. The connection via 143 may include a via for signals, a via for power, a via for grounding, or the like, and the via for power and the via for grounding may be identical to each other. The second connection via 243 may also be a filled-type via filled with a metal material, or a conformal-type via in which a metal material is formed along a wall surface of a via hole. Moreover, the second connection via 243 may have a tapered shape tapered in a direction from the second semiconductor chip 220 to the second connection structure 240. The second connection via 243 may also be formed by a plating process, and may include a seed layer and a conductor layer.

The second underbump metal 260 may be additionally configured to improve connection reliability of the electrical second connection metal 270 and to improve board level reliability of the second semiconductor package 200A. There may be several tens to several millions of second underbump metals 260, and a larger or smaller number of second underbump metals 260 may be provided. Each second underbump metal 260 may be embedded in the lowermost second insulating layer 242. As such, a passivation layer to cover the lowermost second insulating layer 242 may be omitted. The second underbump metal 260 may be formed by a known metallization method using a metal, but is not limited thereto.

The other descriptions are substantially the same as the detailed description of the second semiconductor package 200A according to another example embodiment, and will be omitted herein.

Figure 17:
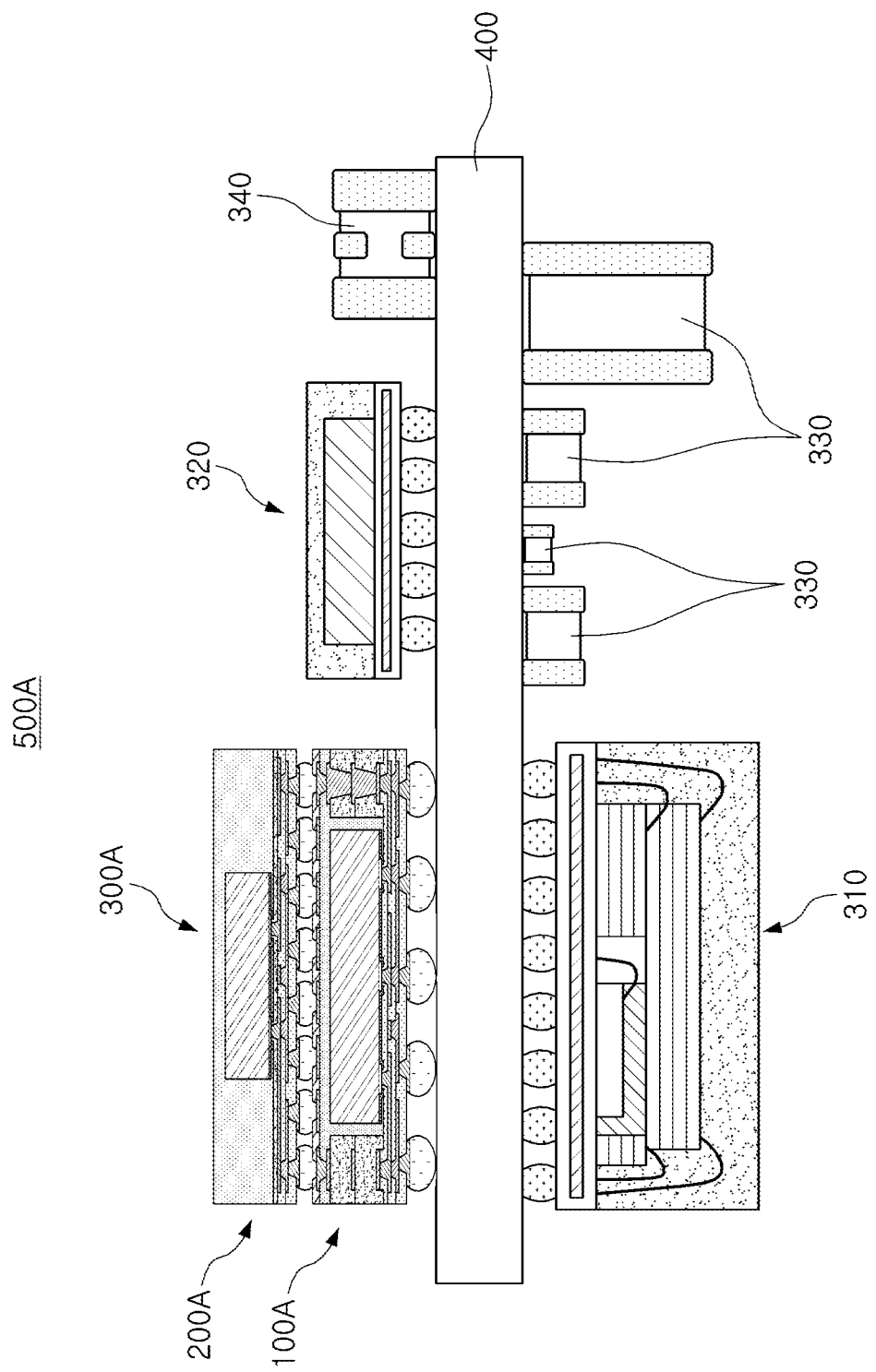
FIG. 17 is a schematic cross-sectional view illustrating an example of a package connection system.

FIG. 17 is a schematic cross-sectional view illustrating an example of a package connection system.

Referring to FIG. 17, a package connection system 500A according to an example embodiment includes a printed circuit board (PCB) 400 having a first surface and a second surface opposing the first surface, a package-on-package (PoP) 300A, disposed on the first surface of the PCB 400, having a function of an application processor chip, a memory package 310, disposed on the second surface of the PCB 400, having a memory function, a power management package 320, disposed on the first surface of the PCB 400, having a power management function, and first and second passive components 330 and 340 disposed on the first surface and/or the second surface of the PCB 400. The memory package 310 is disposed on the second surface of the PCB 400 in such a manner that at least a portion of the memory package 310 overlaps the package-on-package (PoP) 300A, when viewed from above (or in a plan view). The power management package 320 is disposed on the first surface of the PCB 400 in parallel to the package-on-package (PoP) 300A. Due to such an arrangement, improved signal integrity between the package-on-package (PoP) 300A and the memory package 310 may be secured.

The package-on-package (PoP) 300A has a structure in which the first semiconductor package 100A and the second semiconductor package 200A are laminated, but is not limited thereto. The first semiconductor packages 100B, 100C, and 100D and the second semiconductor package 200B may be laminated in various combinations to be applied to the package connection system 500A.

The memory package 310 may be an embedded multi-chip package (eMCP) including a dynamic random access memory (DRAM), a flash memory, and a controller CTR. The power management package 320 may be a wafer level package (WLP) or a panel level package (PLP) including a power management integrated circuit (PMIC). Each of the packages 310 and 320 may be a fan-in package or a fan-out package.

The first and second passive components 330 and 340 may be independently a capacitor, an inductor, a bead, and the like. The first and second passive components 330 and 340 may be equal or different in size, thickness, and the like. An example of the capacitor may be a multilayer ceramic capacitor (MLCC), a low inductance chip capacitor (LICC), or the like, but is not limited thereto. An example of the inductor may be a power inductor or the like, but is not limited thereto.

Figure 18:
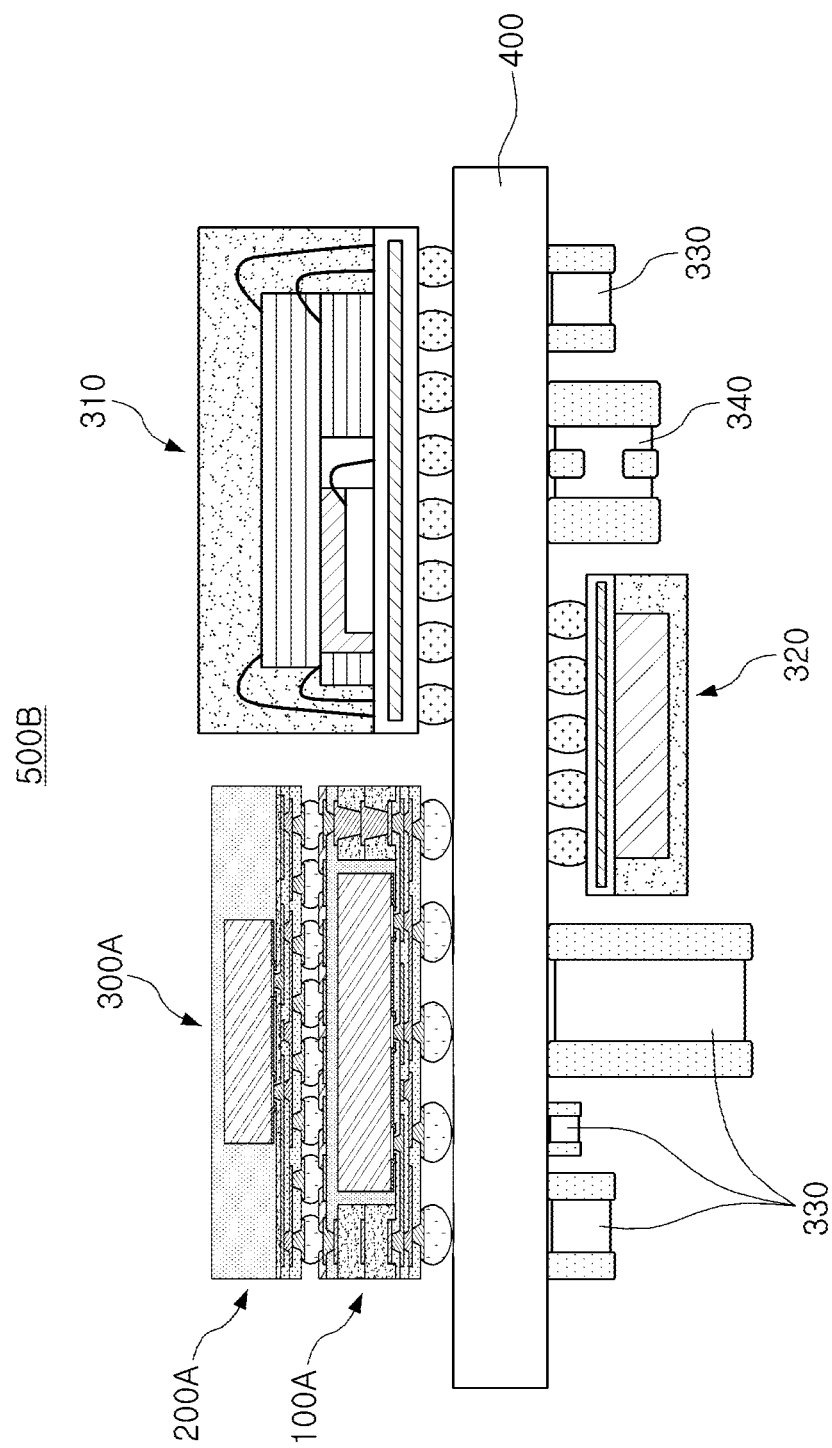
FIG. 18 is a schematic cross-sectional view illustrating another example of the package connection system.

FIG. 18 is a schematic cross-sectional view illustrating another example of the package connection system.

Referring to FIG. 18, a package connection system 500B according to another example embodiment includes a memory package 310 disposed on a first surface of a printed circuit board (PCB) 400 in parallel to a package-on-package (PoP) 300A. A power management package 320 is disposed on a second surface of the PCB 400 in such a manner that at least a portion of the power management package 320 overlaps the package-on-package (PoP) 300A and/or the memory package 300, when viewed from above (or in a plan view). Due to such an arrangement, the package connection system 500B may be applied to a high-end system.

The other descriptions are substantially the same as the detailed description of the package connection system 500A according to another example embodiment, and will be omitted herein.

As described above, a specific unit of an application processor chip may be separated as a semiconductor chip and performance of the specific unit may be enhanced to differentiate functions of a set.

In the present disclosure, the terms "lower side", "lower portion", "lower surface," and the like, have been used to indicate a direction toward a mounted surface of the electronic component package in relation to cross sections of the drawings, the terms "upper side", "upper portion", "upper surface," and the like, have been used to indicate an opposite direction to the direction indicated by the terms "lower side", "lower portion", "lower surface," and the like. However, these directions are defined for convenience of explanation only, and the claims are not particularly limited by the directions defined, as described above.

The meaning of a "connection" of a component to another component in the description includes an indirect connection through an adhesive layer as well as a direct connection between two components. In addition, "electrically connected" means including a physical connection and a physical disconnection. It can be understood that when an element is referred to as "first" and "second", the element is not limited thereby. These terms may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an example embodiment" used herein does not always refer to the same example embodiment, and is provided to emphasize a particular feature or characteristic different from that of another example embodiment. However, example embodiments provided herein are considered to be able to be implemented by being combined in whole or in part one with another. For example, one element described in a particular example embodiment, even if it is not described in another example embodiment, may be understood as a description related to another example embodiment, unless an opposite or contradictory description is provided therein.

Terms used herein are used only in order to describe an example embodiment rather than to limit the present disclosure. In this case, singular forms include plural forms unless necessarily interpreted otherwise, based on a particular context.

While example embodiments have been shown and described above, it will be apparent to those skilled in the art that modifications and variations could be made without departing from the scope of the present disclosure as defined by the appended claims.

What is claimed is:

1. A package-on-package comprising:
    a first semiconductor package including a first semiconductor chip; and
    a second semiconductor package, disposed on the first semiconductor package, including a second semiconductor chip electrically connected to the first semiconductor chip,
    wherein each of the first and second semiconductor chips includes one or more units,
    a number of units of the first semiconductor chip is greater than a number of units of the second semiconductor chip, and
    the one or more units of the first semiconductor chip and the one or more units of the second semiconductor chip implement a function of an application processor chip.

2. The package-on-package of claim 1, wherein the first semiconductor chip includes at least one of a central processing unit (CPU), a graphics processing unit (GPU), or a digital signal processing unit (DSPU), and
    the second semiconductor chip includes at least one of an image signal processing unit (ISPU) or a neural processing unit (NPU).

3. The package-on-package of claim 2, wherein the first semiconductor chip further includes one, not included in the second semiconductor chip, of the image signal processing unit (ISPU) and the neural processing unit (NPU).

4. The package-on-package of claim 2, wherein the first semiconductor chip further includes a memory unit, and at least one of the units of the second semiconductor chip is electrically connected to the memory unit of the first semiconductor chip.

5. The package-on-package of claim 1, wherein the first semiconductor chip has an area larger than an area of the second semiconductor chip, in a plan view.

6. The package-on-package of claim 1, wherein the first semiconductor package comprises:
    a frame having a penetration portion and including one or more wiring layers;
    the first semiconductor chip, disposed in the penetration portion, having a first connection pad; and
    a first connection structure, disposed on the frame and the first semiconductor chip, including one or more first redistribution layers electrically connected to the first connection pad, and
    the one or more wiring layers of the frame are electrically connected to the first connection pad through the one or more first redistribution layers of the first connection structure.

7. The package-on-package of claim 6, wherein the first semiconductor package further comprises:
    a first encapsulant covering at least a portion of each of the first semiconductor chip;
    a backside wiring layer disposed on a side of the first encapsulant opposing a side of the first encapsulant on which the first connection structure is disposed; and
    a backside via penetrating through the first encapsulant and electrically connecting the backside wiring layer and the one or more wiring layers of the frame to each other,
    the second semiconductor package is disposed on the backside wiring layer and is electrically connected to the backside wiring layer through an electrical connection metal, and
    the first semiconductor chip is disposed in a face-down orientation in such a manner that a surface, on which the first connection pad is disposed, faces the first connection structure.

8. The package-on-package of claim 6, wherein the first semiconductor package further comprises:
    a first encapsulant covering at least a portion of each of the frame and the first semiconductor chip;
    a backside wiring layer disposed on a side of the first encapsulant opposing a side of the first encapsulant on which the first connection structure is disposed;
    a backside via penetrating through the first encapsulant and electrically connecting the backside wiring layer and the one or more wiring layers of the frame to each other,
    the second semiconductor package is disposed on the first connection structure and is electrically connected to the one or more first redistribution layers of the first connection structure through an electrical connection metal, and
    the first semiconductor chip is disposed in a face-up orientation in such a manner that a surface, on which the first connection pad is disposed, faces the first connection structure.

9. The package-on-package of claim 6, wherein the frame comprises:
    a first insulating layer;
    a first wiring layer embedded in the first insulating layer while being in contact with the first connection structure;

a second wiring layer disposed on a side of the first insulating layer opposing a side of the first insulating layer in which the first wiring layer is embedded;

a second insulating layer, disposed on the side of the first insulating layer opposing the side of the first insulating layer in which the first wiring layer is embedded, covering at least a portion of the second wiring layer; and a third wiring layer disposed on a side of the second insulating layer opposing a side of the second insulating layer in which the second wiring layer is embedded, and a surface of the first insulating layer, disposed in contact with the first connection structure, has a step with respect to a surface of the first wiring layer disposed in contact with the first connection structure.

10. The package-on-package of claim 6, wherein the frame comprises:

a first insulating layer;

first and second wiring layers respectively disposed on both surfaces of the first insulating layer;

second and third insulating layers, respectively disposed on both surfaces of the first insulating layer, covering at least respective portions of the first and second wiring layers;

a third wiring layer disposed on a side of the third insulating layer opposing a side of the third insulating layer in which the first wiring layer is embedded; and a fourth wiring layer disposed on a side of the third insulating layer opposing a side of the third insulating layer in which the second wiring layer is embedded, and the first insulating layer has a thickness greater than a thickness of each of the second and third insulating layers.

11. The package-on-package of claim 1, wherein the second semiconductor package comprises:

a second connection structure including one or more second redistribution layers, wherein second semiconductor chip is disposed on the second connection structure and electrically connected to the one or more second redistribution layers; and a second encapsulant, disposed on the second connection structure, covering at least a portion of the second semiconductor chip.

12. A package connection system comprising:

a printed circuit board having a first surface and a second surface opposing the first surface;

a package-on-package, disposed on the first surface of the printed circuit board, having a function of an application processor chip;

a memory package, disposed on one of the first and second surfaces of the printed circuit board, having a memory function; and a power management package having a power management function, and disposed on another of the first and second surfaces of the printed circuit board, wherein the package-on-package includes a first semiconductor package including a first semiconductor chip and a second semiconductor package, disposed on the first semiconductor package, including a second semiconductor chip electrically connected to the first semiconductor chip, each of the first and second semiconductor chips includes one or more units, a number of units of the first semiconductor chip is greater than a number of units of the second semiconductor chip, and the one or more units of the first semiconductor chip and the one or more units of the second semiconductor chip implement a function of an application processor (AP) chip.

13. The package connection system of claim 12, wherein the memory package is disposed on the second surface of the printed circuit board in such a manner that at least a portion of the memory package overlaps the package-on-package, in a plan view, and the power management package is disposed on the first surface of the printed circuit board in parallel to the package-on-package.

14. The package connection system of claim 12, wherein the memory package is disposed on the first surface of the printed circuit board in parallel to the package-on-package, and the power management package is disposed on the second surface of the printed circuit board to overlap at least a portion of at least one of the package-on-package and the memory package, in a plan view.

15. The package connection system of claim 12, wherein the memory package includes a dynamic random access memory (DRAM), a flash memory, and a controller, and the power management package includes a power management integrated circuit.

16. The package connection system of claim 12, further comprising:

one or more passive components disposed on at least one of the first and second surfaces of the printed circuit board.

17. The package connection system of claim 12, wherein the package-on-package overlaps one of the memory package and the power management package, in a plan view.

* * * * *